US012683125B2

(12) United States Patent
Decker et al.

(10) Patent No.: US 12,683,125 B2
(45) Date of Patent: Jul. 14, 2026

(54) VARIABLE CAPACITOR ARRAY FOR RF IMPEDANCE MATCHING NETWORK

(71) Applicant: ASM IP HOLDING B.V., Almere (NL)

(72) Inventors: Ronald Anthony Decker, Turnersville, NJ (US); Yogesh B. Jagdale, Haddonfield, NJ (US)

(73) Assignee: ASM IP HOLDING B.V. (NL)

( * ) Notice: Subject to any disclaimer, the term of this patent is extended or adjusted under 35 U.S.C. 154(b) by 317 days.

(21) Appl. No.: 18/414,664

(22) Filed: Jan. 17, 2024

(65) Prior Publication Data

US 2024/0249916 A1 Jul. 25, 2024

Related U.S. Application Data

(60) Provisional application No. 63/440,270, filed on Jan. 20, 2023.

(51) Int. Cl.
*H01G 4/38* (2006.01)
*H01G 7/00* (2006.01)
*H01J 37/32* (2006.01)
*H03H 7/38* (2006.01)

(52) U.S. Cl.
CPC ......... *H01J 37/32183* (2013.01); *H01G 4/38* (2013.01); *H01G 7/00* (2013.01); *H03H 7/38* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 4,177,495 A | 12/1979 | Perret | |
| 4,502,029 A | 2/1985 | Reed | |
| 4,568,895 A | 2/1986 | Reed | |
| 4,930,045 A | 5/1990 | Carlson | |
| 5,367,437 A * | 11/1994 | Anderson | ............... H01G 4/38 |
| | | | 361/810 |
| 5,578,392 A * | 11/1996 | Kawamura | ......... H01M 50/213 |
| | | | 429/178 |

(Continued)

FOREIGN PATENT DOCUMENTS

| | | | | |
|---|---|---|---|---|
| CN | 120221268 A * | 6/2025 | ............. | H01G 4/224 |
| WO | WO-2005029519 A1 * | 3/2005 | ............... | H01G 9/26 |

OTHER PUBLICATIONS

WO '519 translation (Year: 2005).*

*Primary Examiner* — Dion R. Ferguson
(74) *Attorney, Agent, or Firm* — The Belles Group, P.C. (ASM)

(57) ABSTRACT

In one embodiment, a variable capacitance apparatus is disclosed. The variable capacitance apparatus includes a support structure and a plurality of capacitor units. The support structure has a platform, a plurality of walls extending upward from the platform, and a plurality of channels formed between adjacent ones of the walls. Each of the capacitor units has a capacitor and first and second capacitor leads. The plurality of capacitor units are mounted to the support structure so that the plurality of capacitors are positioned within the plurality of channels. Adjacent ones of the plurality of capacitors are separated from one another by one of the plurality of walls to prevent arcing therebetween.

19 Claims, 24 Drawing Sheets

(56)  References Cited

U.S. PATENT DOCUMENTS

| | | | |
|---|---|---|---|
| 6,034,414 | A | 3/2000 | Lin |
| 6,215,278 | B1 | 4/2001 | Okamura |
| 6,300,564 | B1 | 10/2001 | Moraes |
| 6,437,967 | B1 | 8/2002 | Quick |
| 6,473,289 | B1 | 10/2002 | Weisse |
| 6,597,560 | B2 | 7/2003 | Potter |
| 6,631,071 | B2* | 10/2003 | Kitagawa ................. H01G 2/06<br>361/328 |
| 6,650,530 | B2 | 11/2003 | Guillon |
| 6,920,033 | B2 | 7/2005 | Jahreiss |
| 6,923,106 | B2 | 8/2005 | Macdougall |
| 6,954,348 | B1 | 10/2005 | Rodgers |
| 6,975,176 | B2 | 12/2005 | Loke |
| 7,057,878 | B2* | 6/2006 | Vierow ................. H05K 3/301<br>361/328 |
| 7,369,394 | B2 | 5/2008 | Kurioka |
| 7,385,800 | B2 | 6/2008 | Morris, III |
| 7,474,519 | B2 | 1/2009 | Stockman |
| 7,580,245 | B2* | 8/2009 | Inoue ..................... H01G 11/76<br>361/522 |
| 7,987,593 | B1 | 8/2011 | Gorst |
| 8,040,656 | B2 | 10/2011 | Park |
| 8,078,128 | B2 | 12/2011 | Floyd |
| 8,477,473 | B1 | 7/2013 | Koury, Jr. |
| 8,625,253 | B2 | 1/2014 | Goudy, Jr. |
| 8,760,847 | B2* | 6/2014 | Dooley ................... H01G 4/38<br>361/328 |
| 9,159,718 | B2 | 10/2015 | Yen |
| 9,240,282 | B2 | 1/2016 | Murata |
| 9,324,501 | B2 | 4/2016 | Stockman |
| 9,548,162 | B2 | 1/2017 | Ji |
| 10,147,550 | B1 | 12/2018 | Stockman |
| 10,366,840 | B1 | 7/2019 | Stockman |
| 11,183,335 | B2 | 11/2021 | Stockman |
| 2003/0133251 | A1* | 7/2003 | Kitagawa ............... H05K 3/301<br>361/328 |
| 2003/0231477 | A1* | 12/2003 | Vierow .................. H05K 3/301<br>361/801 |
| 2006/0066319 | A1 | 3/2006 | Dallenbach |
| 2008/0297972 | A1 | 12/2008 | Matz |
| 2009/0146498 | A1 | 6/2009 | Kanno |
| 2012/0139483 | A1* | 6/2012 | Cottet .................. H05K 1/0295<br>174/260 |
| 2013/0285762 | A1 | 10/2013 | Park |
| 2013/0329342 | A1 | 12/2013 | Stockman |
| 2013/0343029 | A1 | 12/2013 | Stockman |
| 2014/0218839 | A1 | 8/2014 | Gaddi |
| 2015/0022991 | A1 | 1/2015 | Stockman |
| 2016/0055971 | A1 | 2/2016 | Gupta |
| 2016/0268052 | A1* | 9/2016 | Gando ..................... H01G 5/38 |
| 2016/0314903 | A1 | 10/2016 | Danov |
| 2018/0261391 | A1 | 9/2018 | Stockman |
| 2020/0161057 | A1 | 5/2020 | Stockman |
| 2021/0313969 | A1 | 10/2021 | Crandell |
| 2022/0165507 | A1* | 5/2022 | Kessler ................... H01G 4/38 |
| 2023/0170154 | A1 | 6/2023 | Meng |
| 2024/0249916 | A1* | 7/2024 | Decker ............. H01J 37/32183 |

* cited by examiner

VARIABLE CAPACITOR ARRAY FOR RF IMPEDANCE MATCHING NETWORK

BACKGROUND

In making semiconductor devices such as microprocessors, memory chips, and another integrated circuits, the semiconductor device fabrication process uses plasma processing at different stages of fabrication. Plasma processing involves energizing a gas mixture by imparting energy to the gas molecules by the introduction of RF (radio frequency) energy into the gas mixture. This gas mixture is typically contained in a vacuum chamber, also called a plasma chamber, and the RF energy is introduced through electrodes or other means in the chamber. In a typical plasma process, the RF generator generates power at the desired RF frequency and power, and this power is transmitted through the RF cables and networks to the plasma chamber.

To provide efficient transfer of power from the RF generator to the plasma chamber, an RF matching network is positioned between the RF generator and the plasma chamber. The purpose of the RF matching network is to transform the plasma impedance to a value suitable for the RF generator. In many cases, particularly in the semiconductor fabrication processes, the RF power is transmitted through 50 Ohm coaxial cables and the system impedance (output impedance) of the RF generators is also 50 Ohm. On the other hand, the impedance of the plasma, driven by the RF power, varies based on the plasma chemistry and other conditions inside the plasma chamber. This impedance must be transformed to non-reactive 50 Ohm (i.e., 50+j0) for maximum power transmission. RF matching network performs this task of continuously transforming the plasma impedance to 50 Ohm for the RF generator. In most cases, this transformation is done such that the impedance on the input side of the RF matching network becomes 50+j0 Ohm, that is, a purely resistive 50 Ohm.

An RF matching network may comprise variable capacitors and a microprocessor-based control circuit to control the capacitors. The value and size of the variable capacitors are influenced by the power handling capability, frequency of operation, and impedance range of the plasma chamber. The predominant variable capacitor in use in RF matching networks is the vacuum variable capacitor (VVC). The VVC is an electromechanical device, consisting of two concentric metallic rings that move in relation to each other to change the capacitance. In complex semiconductor processes, where the impedance changes are very rapid, the rapid and frequent movements put stresses on the VVC leading to their failures. VVC-based RF matching networks are one of the last electromechanical components in the semiconductor fabrication process.

As semiconductor devices shrink in size and become more complex, however, the feature geometries become very small. As a result, the processing time to fabricate these features becomes small, typically in the 5-6 second range. Current RF matching networks take 1-2 seconds to tune the process and this results in unstable process parameters for a significant portion of the process time. Electronically variable capacitor (EVC) technology (see, e.g., U.S. Pat. No. 7,251,121, incorporated herein by reference in its entirety) enables a reduction in this semiconductor processing tune time from 1-2 seconds to less than 500 microseconds. EVC-based matching networks are a type of solid state matching network. Their decreased tune time greatly increases the available stable processing time, thereby improving yield and performance.

While EVC technology is known, it has yet to be developed into an industry-accepted replacement for VVCs. Because an EVC is purely an electronic device, an EVC is not a one-for-one replacement for a VVC in an RF matching network. Further advancements are therefore needed to more fully take advantage of using EVCs as part of an RF matching network. It is further contemplated that EVCs may be incorporated into a variety of RF matching networks, including both single and dual networks, and any other known combination.

BRIEF SUMMARY

The present disclosure may be directed to a variable capacitance apparatus. The variable capacitance apparatus has a support structure and a plurality of capacitor units. The support structure has a platform, a plurality of walls extending upward from the platform, and a channel formed between two adjacent ones of the walls. Each of the plurality of capacitor units has a capacitor and first and second capacitor leads. The plurality of capacitor units are mounted to the support structure so that one of the plurality of capacitors is positioned within the plurality of channels. Adjacent ones of the plurality of capacitors are separated from one another by one of the plurality of walls to prevent arcing therebetween.

In another aspect, a variable capacitance apparatus has a support structure, a switching circuit unit, a potting material, and a plurality of capacitor units. The support structure has a platform and a lower basin beneath the platform. A bottom surface of the platform forms a roof of the lower basin. The switching circuit unit has a first circuit board and a plurality of switches operably mounted on the first circuit board. The switching circuit unit is disposed at least partially within the lower basin. The potting material at least partially fills the lower basin and embeds the plurality of switches. The plurality of capacitor units are mounted to the support structure above the platform, the plurality of capacitor units electrically coupled to the plurality of switches.

In yet another aspect, a variable reactance apparatus has a support structure, a variable reactance circuit associated with the support structure, a second circuit board comprising a lower edge and a plurality of slots extending upward from the lower edge, and at least a portion of an operation circuit operably located on the second circuit board. The second circuit board is mounted to the support structure in an upright manner relative to the platform by (1) slidable mating of the plurality of walls within the plurality of slots of the second circuit board; and (2) slidable mating of a lower portion of the second circuit board within the slot of the at least one slotted wall of the support structure. The portion of the operation circuit is electrically coupled to the variable reactance circuit.

In another aspect, a variable capacitance apparatus has a support structure and a plurality of capacitor units. Each of the plurality of capacitor units has a capacitor and first and second capacitor leads. Each of the plurality of capacitor units is detachably mounted to the support structure to be independently replaceable.

BRIEF DESCRIPTION OF THE DRAWINGS

The present disclosure will become more fully understood from the detailed description and the accompanying drawings, wherein.

DETAILED DESCRIPTION

Figures 1, 2:
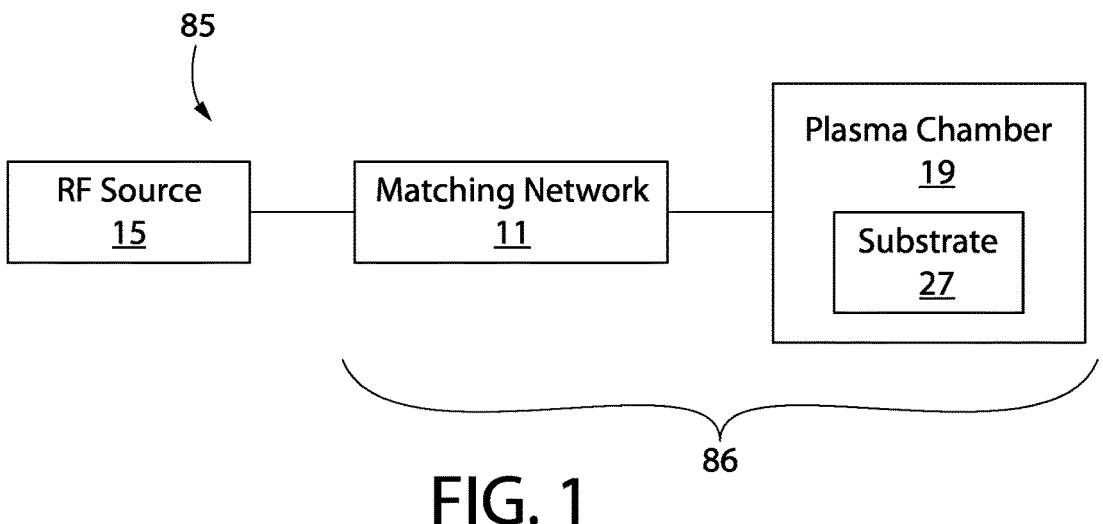
FIG. 1 is a block diagram of an embodiment of a semiconductor processing system.
FIG. 2 is a block diagram of an embodiment of a semiconductor processing system having an L-configuration matching network.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present inventions. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

Features of the present inventions may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present invention may be embodied in the form of computer-implemented processes and apparatuses such as processor-based data processing and communication systems or computer systems for practicing those processes. The present invention may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

In the following description, where circuits are shown and described, one of skill in the art will recognize that, for the sake of clarity, not all peripheral circuits or components are shown in the figures or described in the description. Further, the terms "couple" and "operably couple" can refer to a direct or indirect coupling of two components of a circuit.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top," "bottom," "front" and "rear" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," "secured" and other similar terms refer to a relationship wherein structures are secured or attached to one another either directly or indirectly through intervening structures, as well as both movable or rigid attachments or relationships, unless expressly described otherwise. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

Referring to FIG. 1, a semiconductor device processing system 5 utilizing an RF generator 15 is shown. The system 85 includes an RF generator 15 and a semiconductor processing tool 86. The semiconductor processing tool 86 includes a matching network 11 and a plasma chamber 19. In other embodiments, the generator 15 or other power source can form part of the semiconductor processing tool.

The semiconductor device can be a microprocessor, a memory chip, or other type of integrated circuit or device. A substrate 27 can be placed in the plasma chamber 19, where the plasma chamber 19 is configured to deposit a material layer onto the substrate 27 or etch a material layer from the substrate 27. Plasma processing involves energizing a gas mixture by imparting energy to the gas molecules by introducing RF energy into the gas mixture. This gas mixture is typically contained in a vacuum chamber (the plasma chamber 19), and the RF energy is typically introduced into the plasma chamber 19 through electrodes. Thus, the plasma can be energized by coupling RF power from an RF source 15 into the plasma chamber 19 to perform deposition or etching.

In a typical plasma process, the RF generator 15 generates power at a radio frequency—which is typically within the range of 3 kHz and 300 GHz—and this power is transmitted through RF cables and networks to the plasma chamber 19. In order to provide efficient transfer of power from the RF generator 15 to the plasma chamber 19, an intermediary circuit is used to match the fixed impedance of the RF generator 15 with the variable impedance of the plasma chamber 19. Such an intermediary circuit is commonly referred to as an RF impedance matching network, or more simply as an RF matching network. The purpose of the RF matching network 11 is to transform the variable plasma impedance to a value that more closely matches the fixed impedance of the RF generator 15. Commonly owned U.S. Publication Nos. 2021/0183623 and 2021/0327684, the disclosures of which are incorporated herein by reference in their entirety, provide examples of such matching networks.

FIG. 2 is a block diagram of an embodiment of a semiconductor processing system 85 having a processing tool 86 that includes an L-configuration RF impedance matching network 11. As will be discussed in further detail below, the exemplified matching network 11 utilizes electronically variable capacitors (EVCs) for both the shunt variable capacitor 33 and the series variable capacitor 31. It is noted that the invention is not so limited. For example, one of the EVCs (e.g., shunt EVC 33) may be a mechanically variable VVC, or may be replaced with a variable inductor.

The exemplified matching network 11 has an RF input 13 connected to an RF source 15 and an RF output 17 connected to a plasma chamber 19. An RF input sensor 21 can be connected between the RF impedance matching network 11 and the RF source 15. An RF output sensor 49 can be connected between the RF impedance matching network 11 and the plasma chamber 19 so that the RF output from the impedance matching network, and the plasma impedance presented by the plasma chamber 19, may be monitored. Certain embodiments may include only one of the input sensor 21 and the output sensor 49. The functioning of these sensors 21, 49 are described in greater detail below.

As discussed above, the RF impedance matching network 11 serves to help maximize the amount of RF power transferred from the RF source 15 to the plasma chamber 19 by matching the impedance at the RF input 13 to the fixed impedance of the RF source 15. The matching network 11 can consist of a single module within a single housing designed for electrical connection to the RF source 15 and plasma chamber 19. In other embodiments, the components of the matching network 11 can be located in different housings, some components can be outside of the housing, and/or some components can share a housing with a component outside the matching network.

As is known in the art, the plasma within a plasma chamber 19 typically undergoes certain fluctuations so that the impedance presented by the plasma chamber 19 is a variable impedance. Some of these changes in impedance are outside of operational control, while others are intentionally controlled. Changes may include gas chemistry, pressure, and other variables that can affect impedance.

Since the variable impedance of the plasma chamber 19 cannot be fully controlled, and an impedance matching network may be used to create an impedance match between the plasma chamber 19 and the RF source 15. Moreover, the impedance of the RF source 15 may be fixed at a set value by the design of the particular RF source 15. Although the fixed impedance of an RF source 15 may undergo minor fluctuations during use, due to, for example, temperature or other environmental variations, the impedance of the RF source 15 is still considered a fixed impedance for purposes of impedance matching because the fluctuations do not significantly vary the fixed impedance from the originally set impedance value. Other types of RF source 15 may be designed so that the impedance of the RF source 15 may be set at the time of, or during, use. The impedance of such types of RF sources 15 is still considered fixed because it may be controlled by a user (or at least controlled by a programmable controller) and the set value of the impedance may be known at any time during operation, thus making the set value effectively a fixed impedance.

The RF source 15 may be an RF generator of a type that is well-known in the art, and generates an RF signal at an appropriate frequency and power for the process performed within the plasma chamber 19. The RF source 15 may be electrically connected to the RF input 13 of the RF impedance matching network 11 using a coaxial cable, which for impedance matching purposes would have the same fixed impedance as the RF source 15. Alternately, no coaxial cable is utilized because the RF generator and the RF impedance matching network 11 are within the same enclosure or otherwise directly connected.

The plasma chamber 19 includes a first electrode 23 and a second electrode 25, and in processes that are well known in the art, the first and second electrodes 23, 25, in conjunction with appropriate control systems (not shown) and the plasma in the plasma chamber, enable one or both of deposition of materials onto a substrate 27 and etching of materials from the substrate 27.

In the exemplified embodiment, the RF impedance matching network 11 includes a series variable capacitor 31, a shunt variable capacitor 33, and a series inductor 35 to form an 'L' type matching network. The shunt variable capacitor 33 is shown shunting to a reference potential, in this case ground 40, between the series variable capacitor 31 and the series inductor 35, and one of skill in the art will recognize that the RF impedance matching network 11 may be configured with the shunt variable capacitor 33 shunting to a reference potential at the RF input 13 or at the RF output 17.

Figure 3:
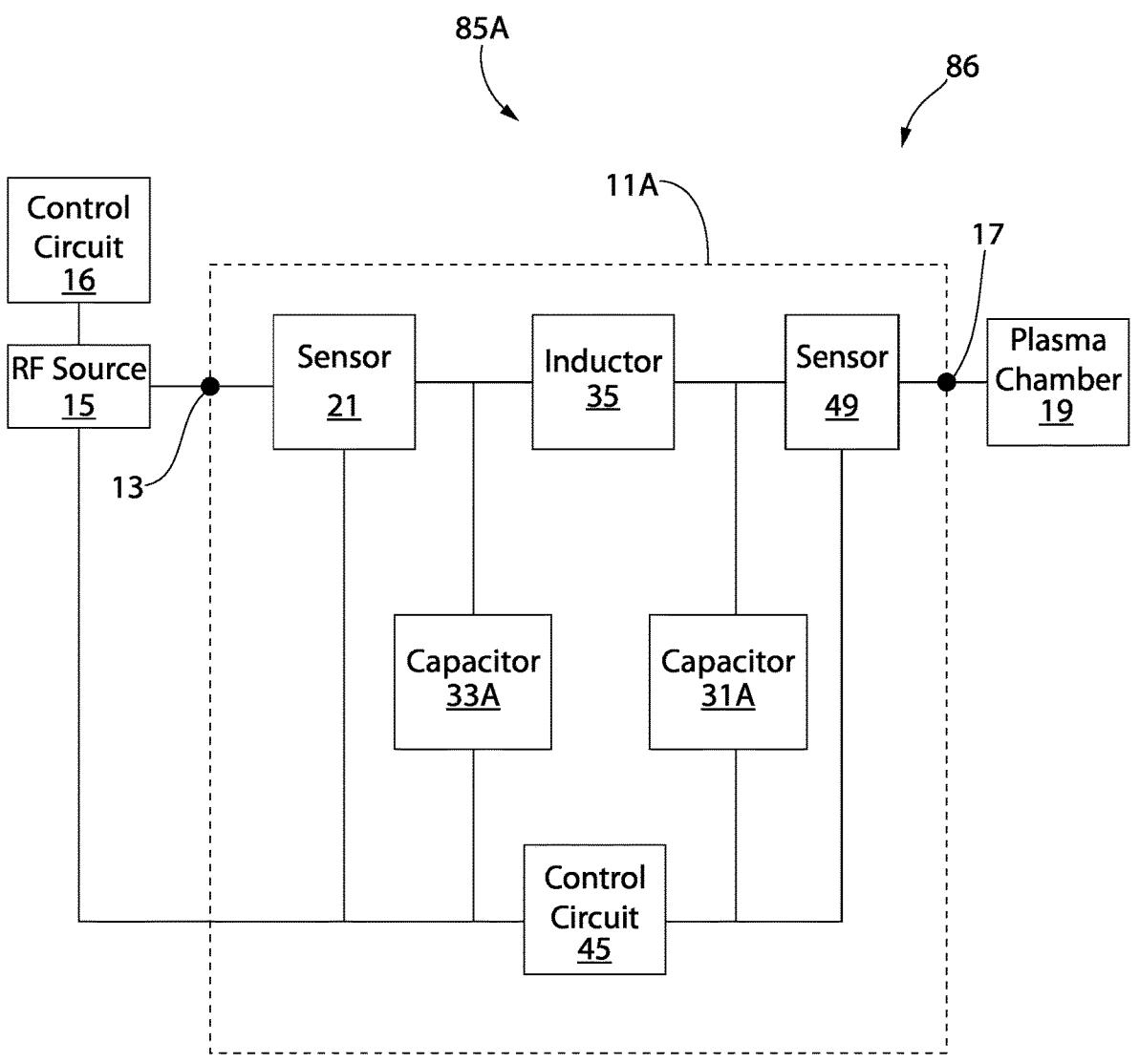
FIG. 3 is a block diagram of an embodiment of a semiconductor processing system having a pi-configuration matching network.

Alternatively, the RF impedance matching network 11 may be configured in other matching network configurations, such as a 'T' type configuration or a 'Π' or 'pi' type configuration, as will be shown in FIG. 3. In certain embodiments, the variable capacitors and the switching circuit described below may be included in any configuration appropriate for an RF impedance matching network.

In the exemplified embodiment, each of the series variable capacitor 31 and the shunt variable capacitor 33 may be an electronic variable capacitor (EVC), as described in U.S. Pat. No. 7,251,121, the EVC being effectively formed as a capacitor array formed by a plurality of discrete capacitors. The series variable capacitor 31 is coupled in series between the RF input 13 and the RF output 17 (which is also in parallel between the RF source 15 and the plasma chamber 19). The shunt variable capacitor 33 is coupled in parallel between the RF input 13 and ground 40. In other configurations, the shunt variable capacitor 33 may be coupled in parallel between the RF output 19 and ground 40. Other configurations may also be implemented without departing from the functionality of an RF matching network. In still other configurations, the shunt variable capacitor 33 may be coupled in parallel between a reference potential and one of the RF input 13 and the RF output 19.

The series variable capacitor 31 is connected to a series RF choke and filter circuit 37 and to a series driver circuit 39. Similarly, the shunt variable capacitor 33 is connected to a shunt RF choke and filter circuit 41 and to a shunt driver circuit 43. Each of the series and shunt driver circuits 39, 43 are connected to a control circuit 45, which is configured with an appropriate processor and/or signal generating circuitry to provide an input signal for controlling the series and shunt driver circuits 39, 43. A power supply 47 is connected to each of the RF input sensor 21, the series driver circuit 39, the shunt driver circuit 43, and the control circuit 45 to provide operational power, at the designed currents and voltages, to each of these components. The voltage levels provided by the power supply 47, and thus the voltage levels employed by each of the RF input sensor 21, the series driver circuit 39, the shunt driver circuit 43, and the control circuit 45 to perform the respective designated tasks, is a matter of design choice. In other embodiments, a variety of electronic components can be used to enable the control circuit 45 to send instructions to the variable capacitors. Further, while the driver circuit and RF choke and filter are shown as separate from the control circuit 45, these components can also be considered as forming part of the control circuit 45.

In the exemplified embodiment, the control circuit 45 includes a processor. The processor may be any type of properly programmed processing device (or collection of two or more processing devices working together), such as a computer or microprocessor, configured for executing computer program instructions (e.g., code). The processor may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/ output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network to perform the functions described herein.

With the combination of the series variable capacitor 31 and the shunt variable capacitor 33, the combined impedances of the RF impedance matching network 11 and the plasma chamber 19 may be controlled, using the control circuit 45, the series driver circuit 39, the shunt driver circuit 43, to match, or at least to substantially match, the fixed impedance of the RF source 15.

The control circuit 45 is the brains of the RF impedance matching network 11, as it receives multiple inputs, from sources such as the RF input sensor 21 and the series and shunt variable capacitors 31, 33, makes the calculations necessary to determine changes to the series and shunt variable capacitors 31, 33, and delivers commands to the series and shunt variable capacitors 31, 33 to create the impedance match. The control circuit 45 is of the type of control circuit that is commonly used in semiconductor fabrication processes, and therefore known to those of skill in the art. Any differences in the control circuit 45, as compared to control circuits of the prior art, arise in programming differences to account for the speeds at which the RF impedance matching network 11 is able to perform switching of the variable capacitors 31, 33 and impedance matching.

Each of the series and shunt RF choke and filter circuits 37, 41 are configured so that DC signals may pass between the series and shunt driver circuits 39, 43 and the respective series and shunt variable capacitors 31, 33, while at the same time the RF signal from the RF source 15 is blocked to prevent the RF signal from leaking into the outputs of the series and shunt driver circuits 39, 43 and the output of the control circuit 45. The series and shunt RF choke and filter circuits 37, 41 are of a type known to those of skill in the art.

FIG. 3 is a block diagram of an embodiment of a semiconductor processing system 85A having a pi-configuration matching network 11A, as opposed to the L-configuration matching network of FIG. 2. For case of understanding, this figure omits the RF chokes and filters, driver circuits, and power supplies of FIG. 2. Where FIG. 3 uses reference numbers identical to those of FIG. 2, it is understood that the relevant components can have features similar to those discussed with regard to FIG. 2.

The most significant difference between the L- and pi-configuration is that the L-configuration utilizes a series capacitor 31 and shunt capacitor 33, while the pi-configuration utilizes two shunt capacitors 31A, 33A. Nevertheless, the control circuit can alter the capacitance of these shunt variable capacitors 31A, 33A to cause an impedance match. Each of these shunt variable capacitors 31A, 33A can be an EVC, as discussed above. They can be controlled by a choke, filter, and driver similar to the methods discussed above with respect to FIG. 2.

Figure 4:
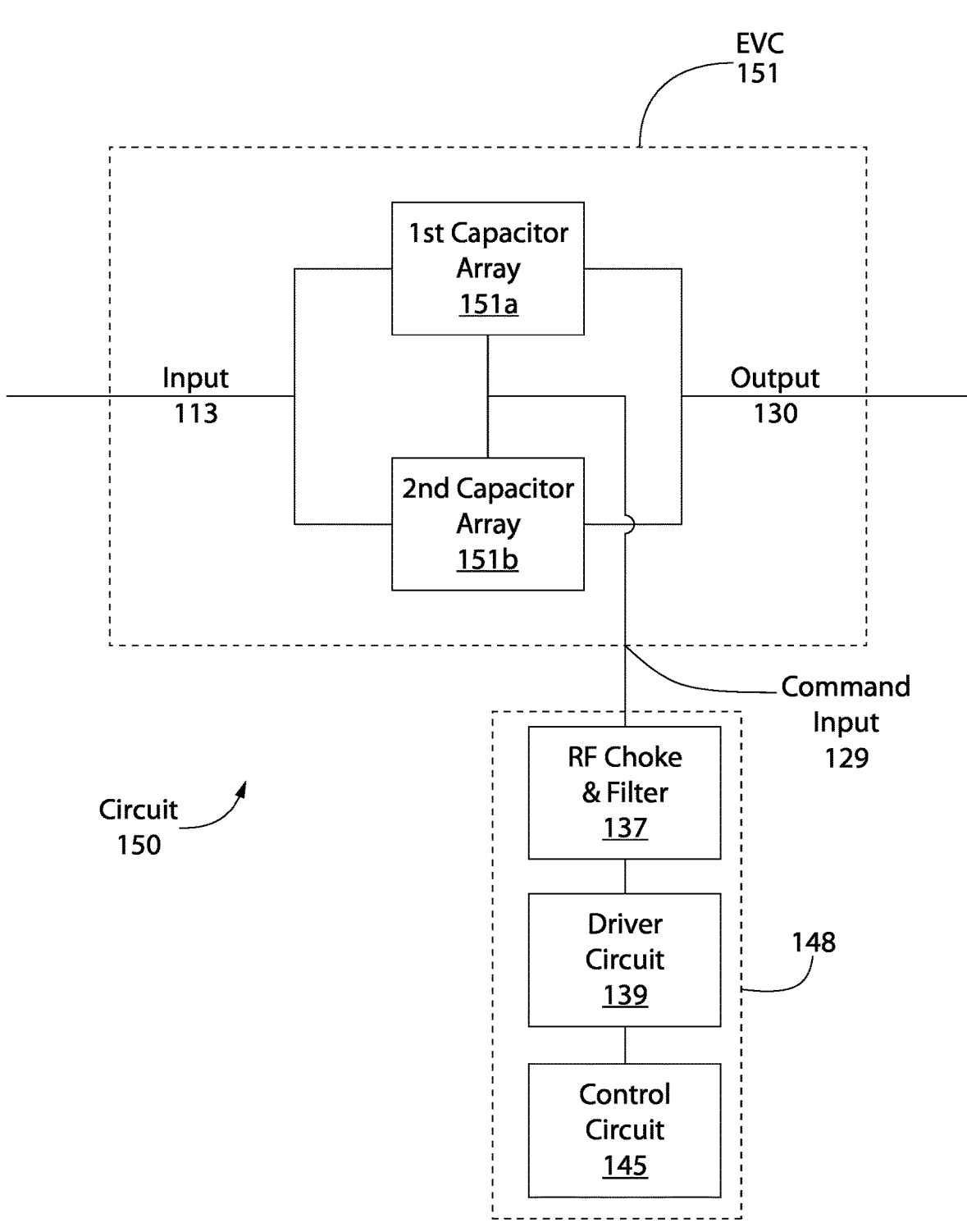
FIG. 4 is a block diagram for an embodiment of a circuit for providing a variable capacitance using an electronically variable capacitor.

FIG. 4 is a block diagram for an embodiment of an electronic circuit 150 for providing a variable capacitance using an electronically variable capacitor 151. The circuit 150 utilizes an EVC 151 that includes two capacitor arrays 151a, 151b. The exemplified first capacitor array 151a has a first plurality of discrete fixed capacitors, each having a first capacitance value. The second capacitor array 151b has a second plurality of discrete fixed capacitors, each having a second capacitance value. The first capacitance value is different from the second capacitance value such that the EVC 151 can provide coarse and fine control of the capacitance produced by the EVC 151. The first capacitor array and the second capacitor array are coupled in parallel between a signal input 113 and a signal output 130.

The first and second capacitance values can be any values sufficient to provide the desired overall capacitance values for the EVC 151. In one embodiment, the second capacitance value is less than or equal to one-half (½) of the first capacitance value. In another embodiment, the second capacitance value is less than or equal to one-third (⅓) of the first capacitance value. In yet another embodiment, the second capacitance value is less than or equal to one-fourth (¼) of the first capacitance value.

The electronic circuit 150 further includes a control circuit 145, which can have features similar to control circuit 45 discussed above. The control circuit 145 is operably coupled to the first capacitor array 151a and to the second capacitor array 151b by a command input 129, the command input 129 being operably coupled to the first capacitor array 151a and to the second capacitor array 151b. In the exemplified embodiment, the command input 129 has a direct electrical connection to the capacitor arrays 151a, 151b, though in other embodiments this connection can be indirect. The coupling of the control circuit 145 to the capacitor arrays 151a, 151b will be discussed in further detail below.

The control circuit 145 is configured to alter the variable capacitance of the EVC 151 by controlling on and off states of (a) each discrete fixed capacitor of the first plurality of discrete fixed capacitors and (b) each discrete fixed capacitor of the second plurality of discrete fixed capacitors. As stated above, the control circuit 145 can have features similar to those described with respect to control circuit 45 of the preceding figures. For example, the control circuit 145 can receive inputs from the capacitor arrays 151a, 151b, make calculations to determine changes to capacitor arrays 151a, 151b, and delivers commands to the capacitor arrays 151a, 151b for altering the capacitance of the EVC 151. The EVC 151 of FIG. 4 can include a plurality of electronic switches. Each electronic switch can be configured to activate and deactivate one or more discrete capacitors.

As with the control circuit 45 of the preceding figures, the control circuit 145 can also be connected to a driver circuit 139 and an RF choke and filter circuit 137. The control circuit 145, driver circuit 139, and RF choke and filter circuit 137 can have capabilities similar to those discussed with regard to the preceding figures. In the exemplified embodiment, the driver circuit 139 is operatively coupled between the control circuit 145 and the first and second capacitor arrays 151a, 151b. The driver circuit 139 is configured to alter the variable capacitance based upon a control signal received from the control circuit 145. The RF filter 137 is operatively coupled between the driver circuit 139 and the first and second capacitor arrays 151a, 151b. The control circuit 145, driver circuit 139, and RF choke and filter circuit 137 collectively form an operation circuit 148 which controls and operates the EVC 151.

In response to the control signal sent by the control unit 145, the driver circuit 139 and RF filter 137 are configured to send a command signal to the command input 129. The command signal is configured to alter the variable capacitance by instructing at least one of the electronic switches to activate or deactivate (a) at least one the discrete capacitors of the first plurality of discrete capacitors or (b) at least one of the discrete capacitors of the second plurality of discrete capacitors.

In the exemplified embodiment, the driver circuit 139 is configured to switch a high voltage source on or off in less than 15 μsec, the high voltage source controlling the electronic switches of each of the first and second capacitor arrays for purposes of altering the variable capacitance. The EVC 151, however, can be switched by any of the means or speeds discussed in the present application.

The control circuit 145 can be configured to calculate coarse and fine capacitance values to be provided by the respective capacitor arrays 151a, 151b. In the exemplified embodiment, the control circuit 145 is configured to calculate a coarse capacitance value to be provided by controlling the on and off states of the first capacitor array 151a. Further, the control circuit is configured to calculate a fine capacitance value to be provided by controlling the on and off states of the second capacitor array 151b. In other embodiments, the capacitor arrays 151a, 151b can provide alternative levels of capacitance. In other embodiments, the EVC can utilize additional capacitor arrays.

The EVC 151 of FIG. 4 can be used in a variety of systems requiring a varying capacitance. For example, EVC 151 can be used as the series EVC and/or shunt EVC in an L matching network, or as one or both of the shunt EVCs in a pi matching network. It is often desired that the differences between the capacitance values allow for both a sufficiently fine resolution of the overall capacitance of the circuit and a wide range of capacitance values to enable a better impedance match at the input of a RF matching network, and EVC 151 allows this.

As discussed above, an EVC is a type of variable capacitor that can use multiple switches, each used to create an open or short circuit, with individual series capacitors to change the capacitance of the variable capacitor. The switches can be mechanical (such as relays) or solid state (such as PIN diodes, transistors, or other switching devices). The following is a discussion of methods for setting up an EVC or other variable capacitor to provide varying capacitances.

In what is sometimes referred to as an "accumulative setup" of an EVC or other variable capacitor, the approach to linearly increase the capacitor value from the minimum starting point (where all switches are open) is to incrementally increase the number of fine tune capacitors that are switched into the circuit. Once the maximum number of fine tune capacitors is switched into circuit, a coarse tune capacitor is switched in, and the fine tune capacitors are switched out. The process starts over with increasing the number of fine tune capacitors that are switched into circuit, until all fine and coarse tune capacitors are switched in, at which point another coarse tune capacitor is switched in and the fine tune capacitors are switched out. This process can continue until all the coarse and fine capacitors are switched in.

In this embodiment, all of the fine tune capacitors have the same or a substantially similar value, and all the coarse tune capacitors have the same or a substantially similar value. Further, the capacitance value of one coarse tune capacitor about equals the combined capacitance value of all fine tune capacitors plus an additional fine tune capacitor into the circuit, thus enabling a linear increase in capacitance. The embodiments, however, are not so limited. The fine tune capacitors (and coarse capacitors) need not have the same or a substantially similar value. Further, the capacitance value of one coarse tune capacitor need not equal the combined capacitance value of all fine tune capacitors plus an additional fine tune capacitor. In one embodiment, the coarse capacitance value and the fine capacitance value have a ratio substantially similar to 10:1. In another embodiment, the second capacitance value is less than or equal to one-half (½) of the first capacitance value. In another embodiment, the second capacitance value is less than or equal to one-third (⅓) of the first capacitance value. In yet another embodiment, the second capacitance value is less than or equal to one-fourth (¼) of the first capacitance value.

An example of the aforementioned embodiment in an ideal setting would be if the fine tune capacitors were equal to 1 pF, and the coarse tune capacitors were equal to 10 pF. In this ideal setup, when all switches are open, the capacitance is equal to 0 pF. When the first switch is closed, there is 1 pF in the circuit. When the second switch is closed there is 2 pF in the circuit, and so on, until nine fine tune switches are closed, giving 9 pF. Then, the first 10 pF capacitor is switched into circuit and the nine fine tune switches are opened, giving a total capacitance of 10 pF. The fine tune capacitors are then switched into circuit from 11 pF to 19 pF. Another coarse tune capacitor can then be switched into circuit and all fine tune capacitors can be switched out of circuit giving 20 pF. This process can be repeated until the desired capacitance is reached.

This can also be taken one step further. Using the previous example, having nine 1 pF capacitors and also nine 10 pF capacitors, the variable capacitor circuit can have even larger values, 100 pF, to switch in and out of circuit. This would allow the previous capacitor array to go up to 99 pF, and then the 100 pF capacitor can be used for the next increment. This can be repeated further using larger increments, and can also be used with any counting system. According to the accumulative setup, increasing the total capacitance of a variable capacitor is achieved by switching in more of the coarse capacitors or more of the fine capacitors than are already switched in without switching out a coarse capacitor that is already switched in. Further, when the variable total capacitance is increased and the control circuit does not switch in more of the coarse capacitors than are already switched in, then the control circuit switches in more fine capacitors than are already switched in without switching out a fine capacitor that is already switched in. U.S. Pat. Nos. 10,431,428 and 11,195,698 regarding accumulative setup are incorporated herein by reference in their entirety. It is noted that the claimed invention is not limited to use of the accumulative setup. For example, U.S. Pat. Nos. 10,679,824 and 10,692,699, incorporated herein by reference in their entirety, discusses alternative setups, such as "partial binary."

Figure 5:
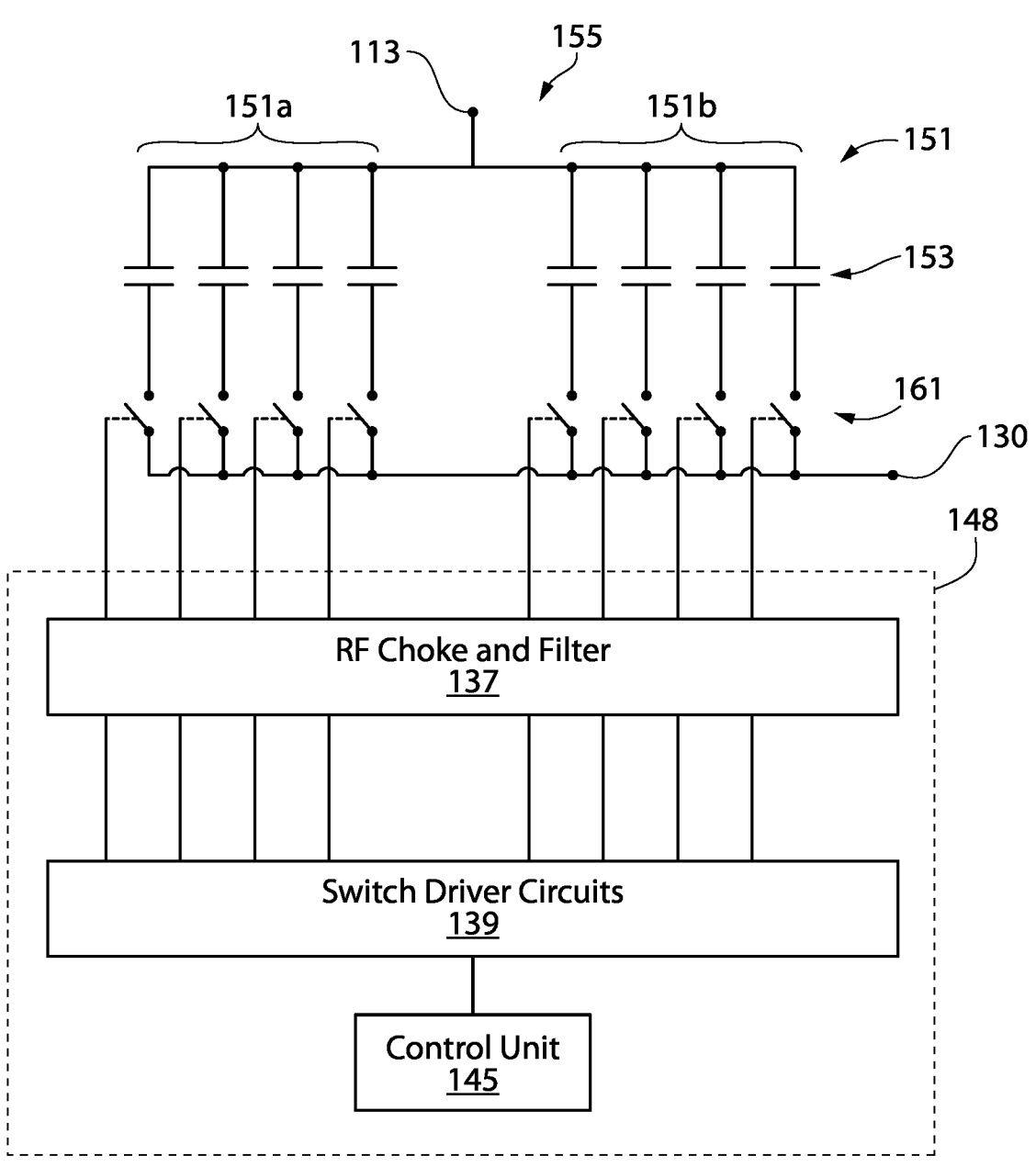
FIG. 5 is a schematic of a variable capacitance system for switching in and out discrete capacitors of an electronically variable capacitor.
Figure 6:
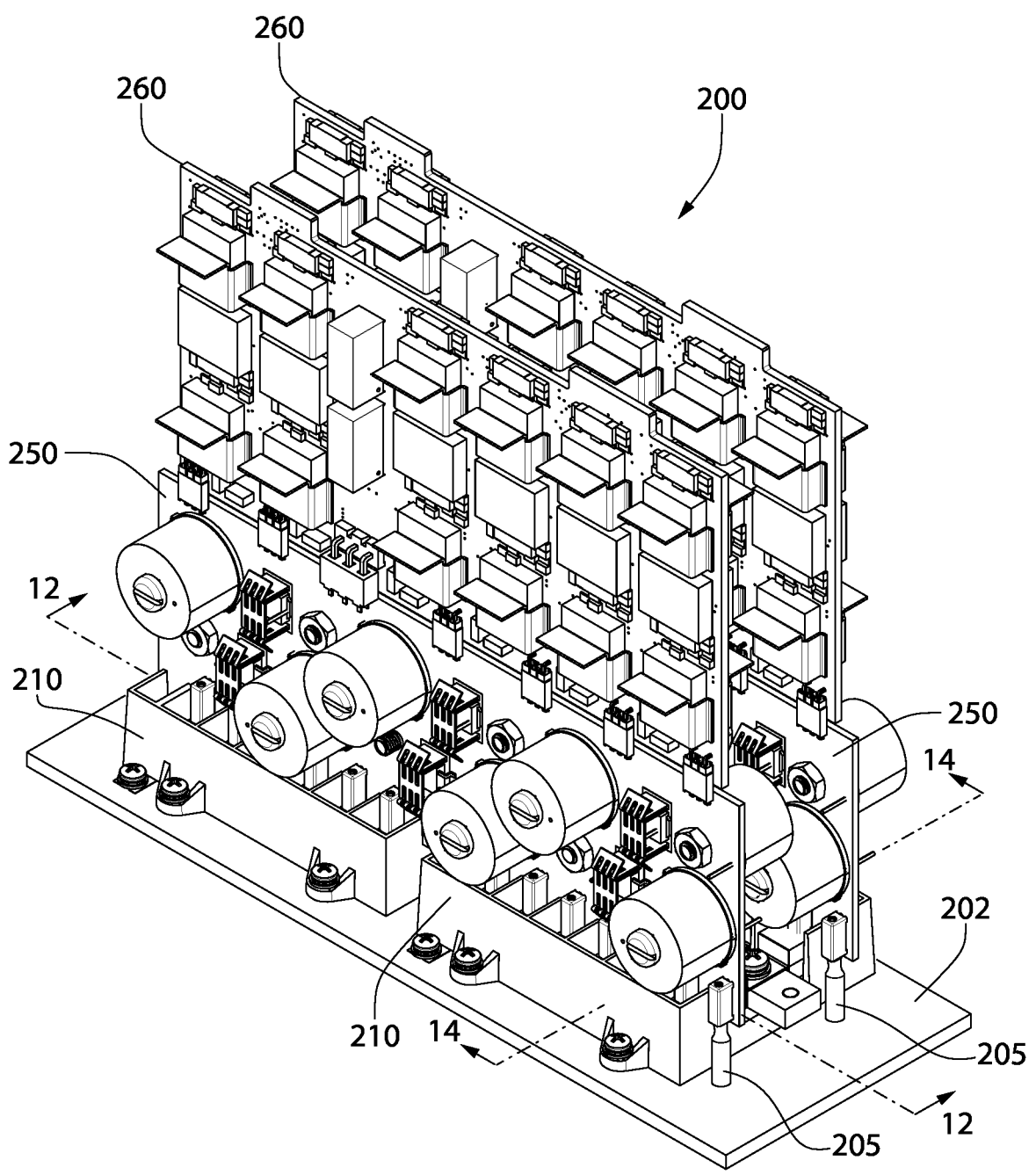
FIG. 6 is a perspective view of a variable capacitance apparatus.
Figure 7:
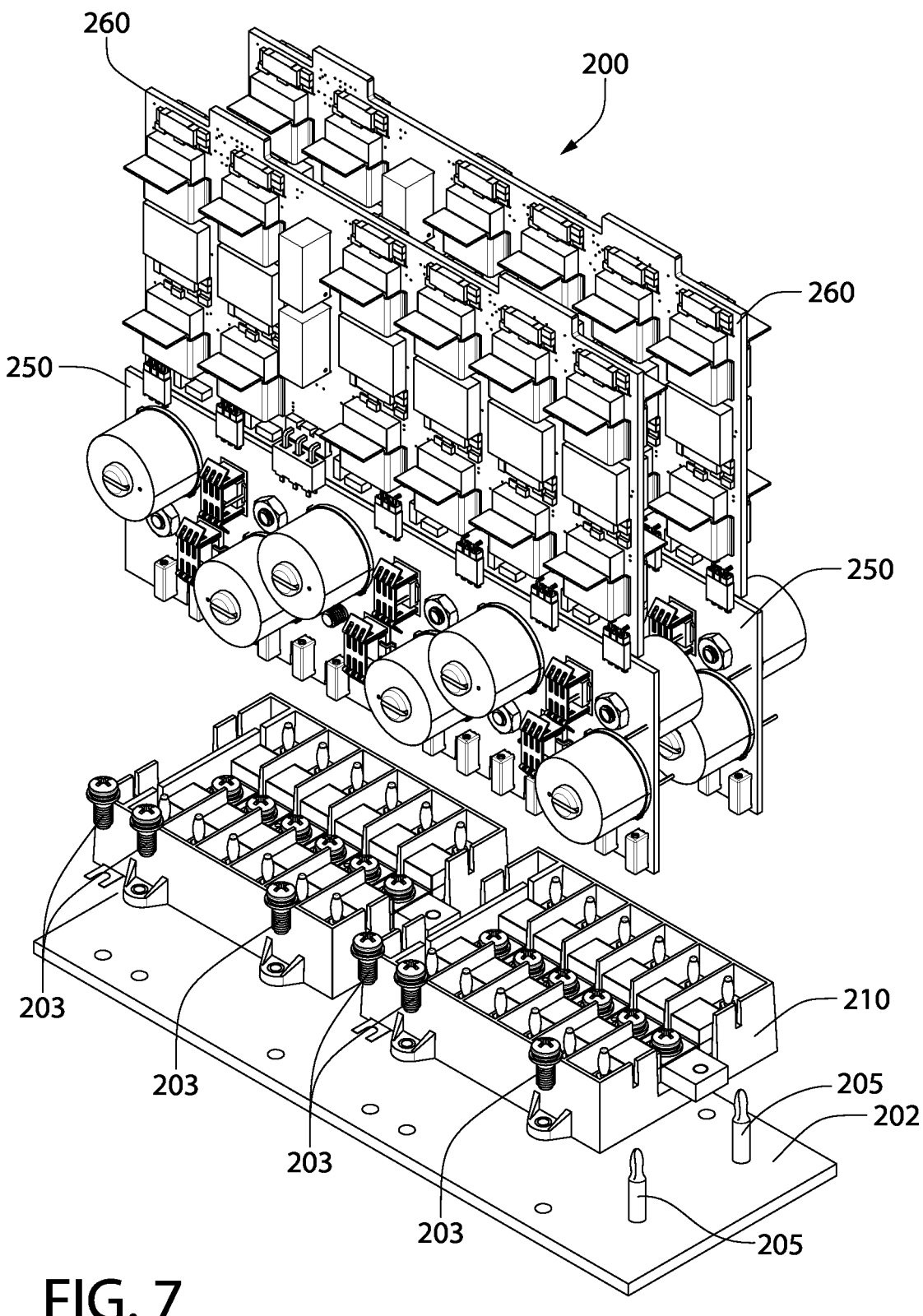
FIG. 7 is an exploded view of the variable capacitance apparatus.
Figure 8:
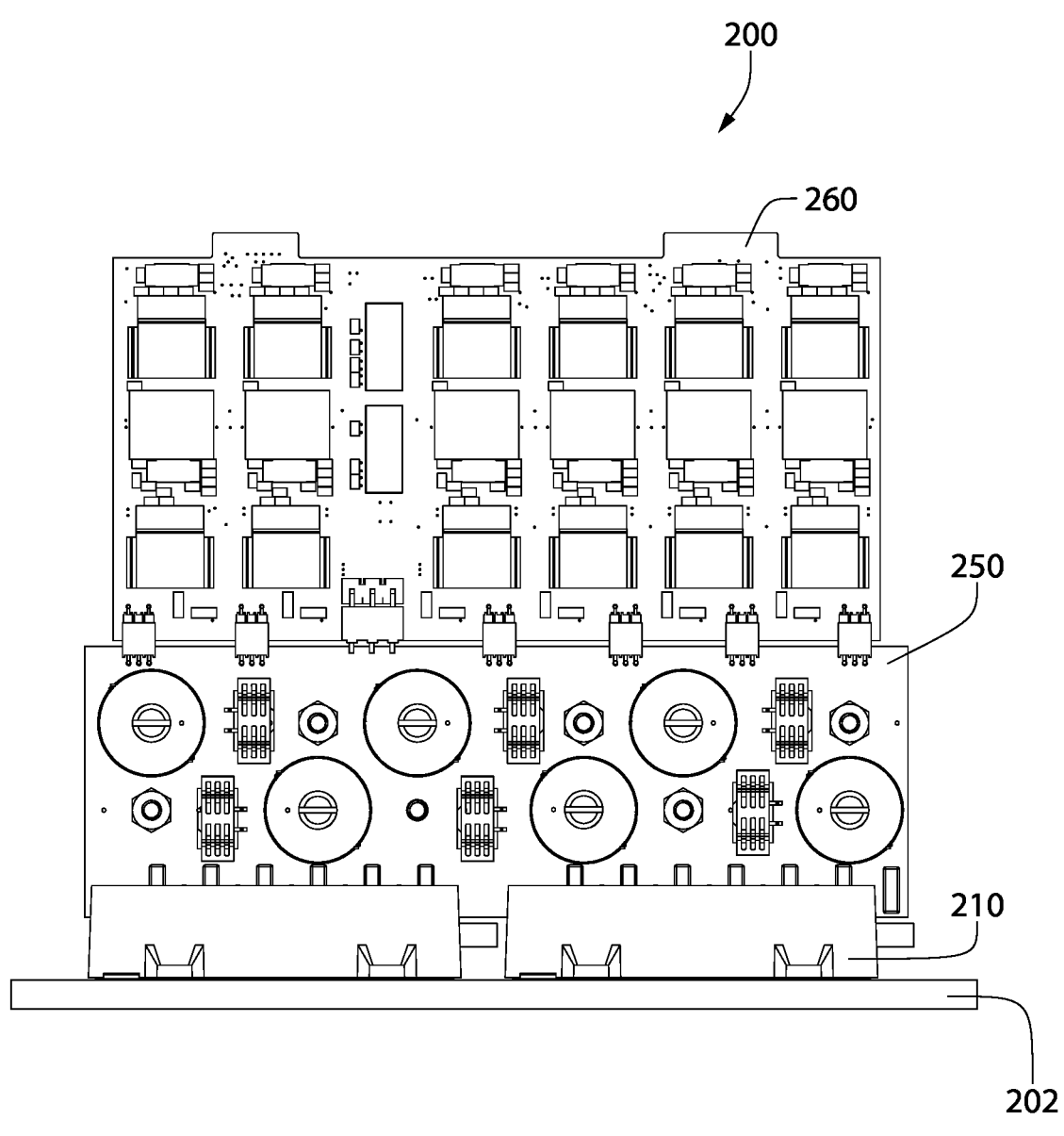
FIG. 8 is a front view of the variable capacitance apparatus.
Figure 9:
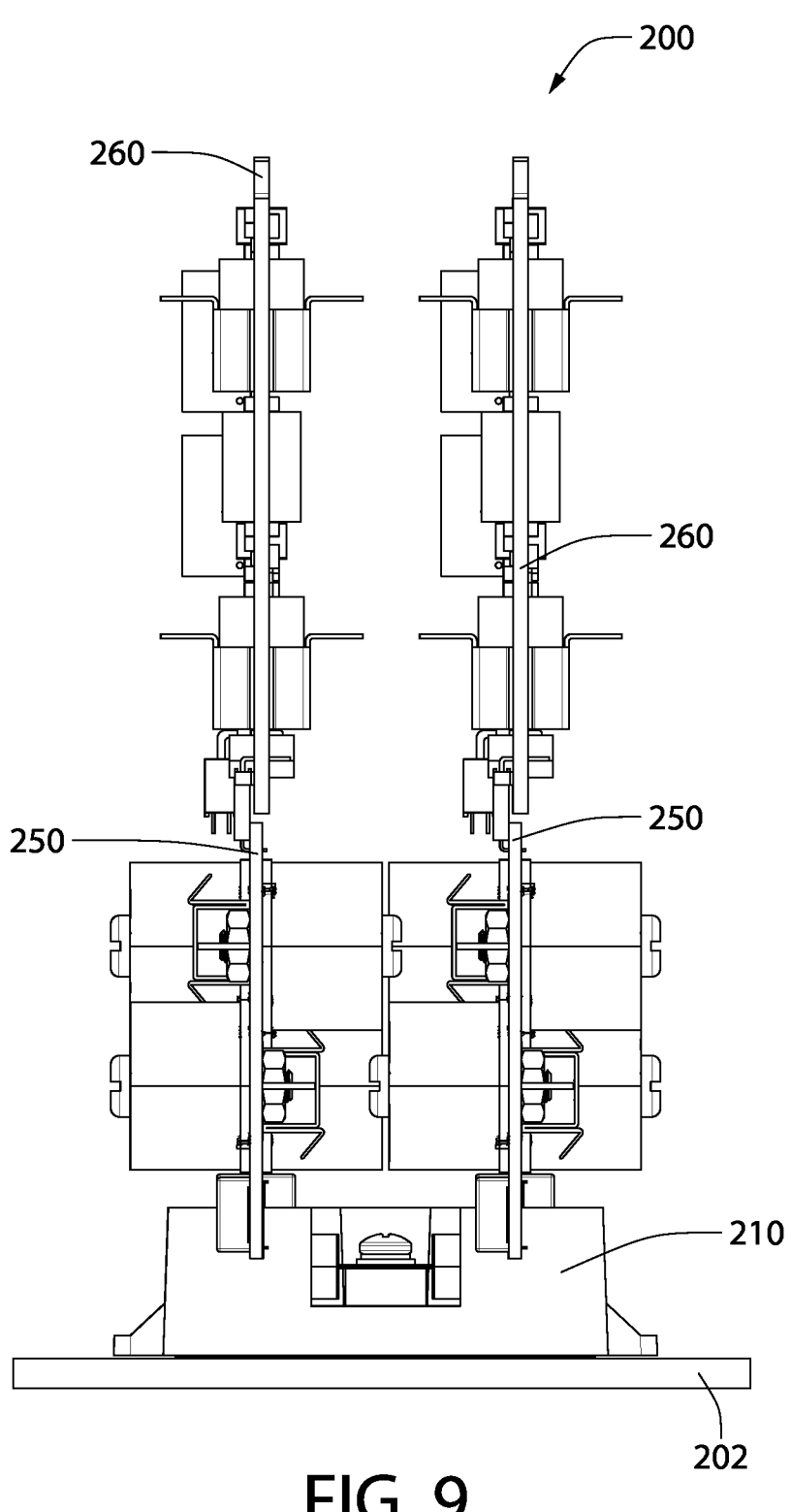
FIG. 9 is a right side view of the variable capacitance apparatus.
Figure 10:
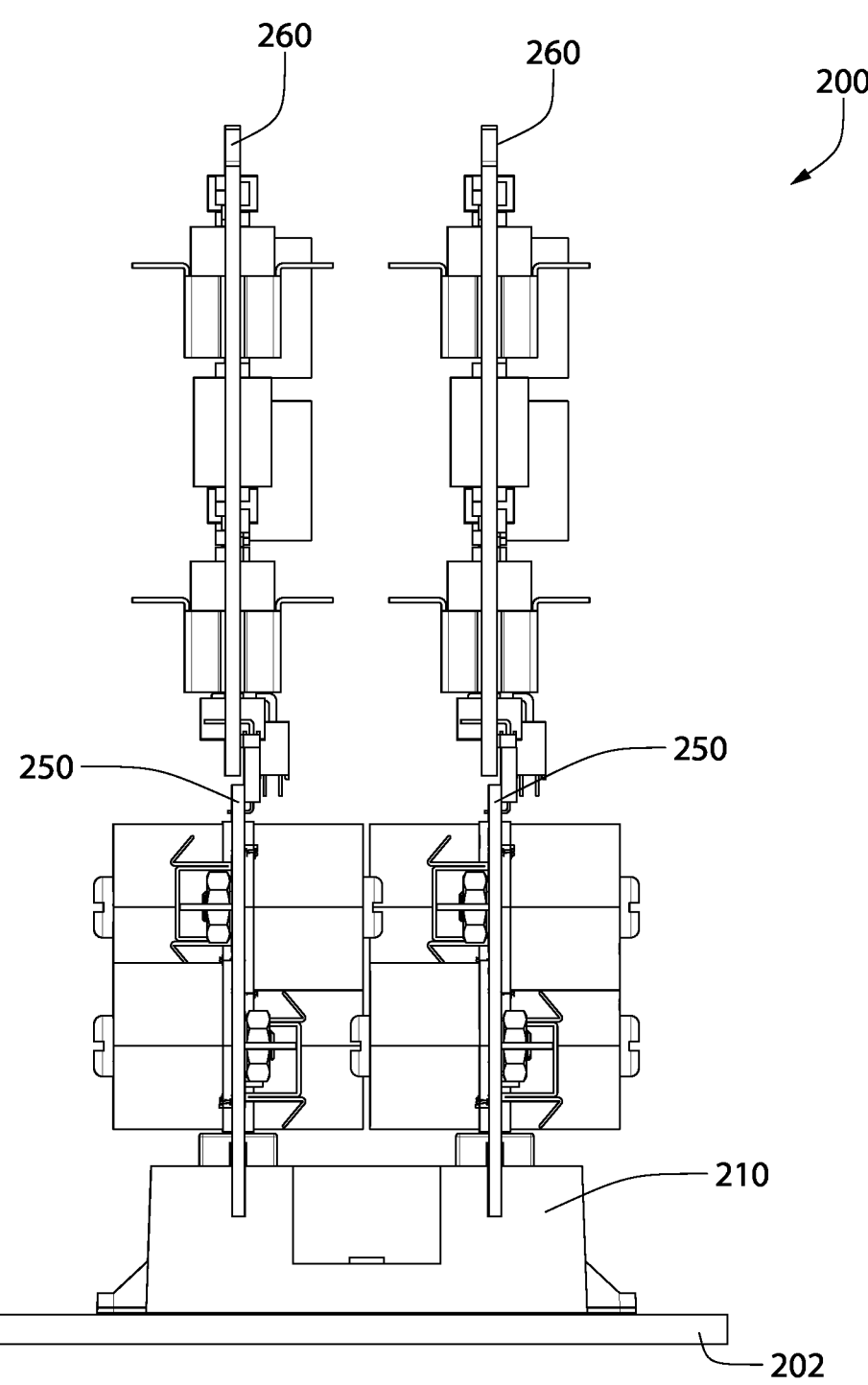
FIG. 10 is a left side view of the variable capacitance apparatus.
Figure 11:
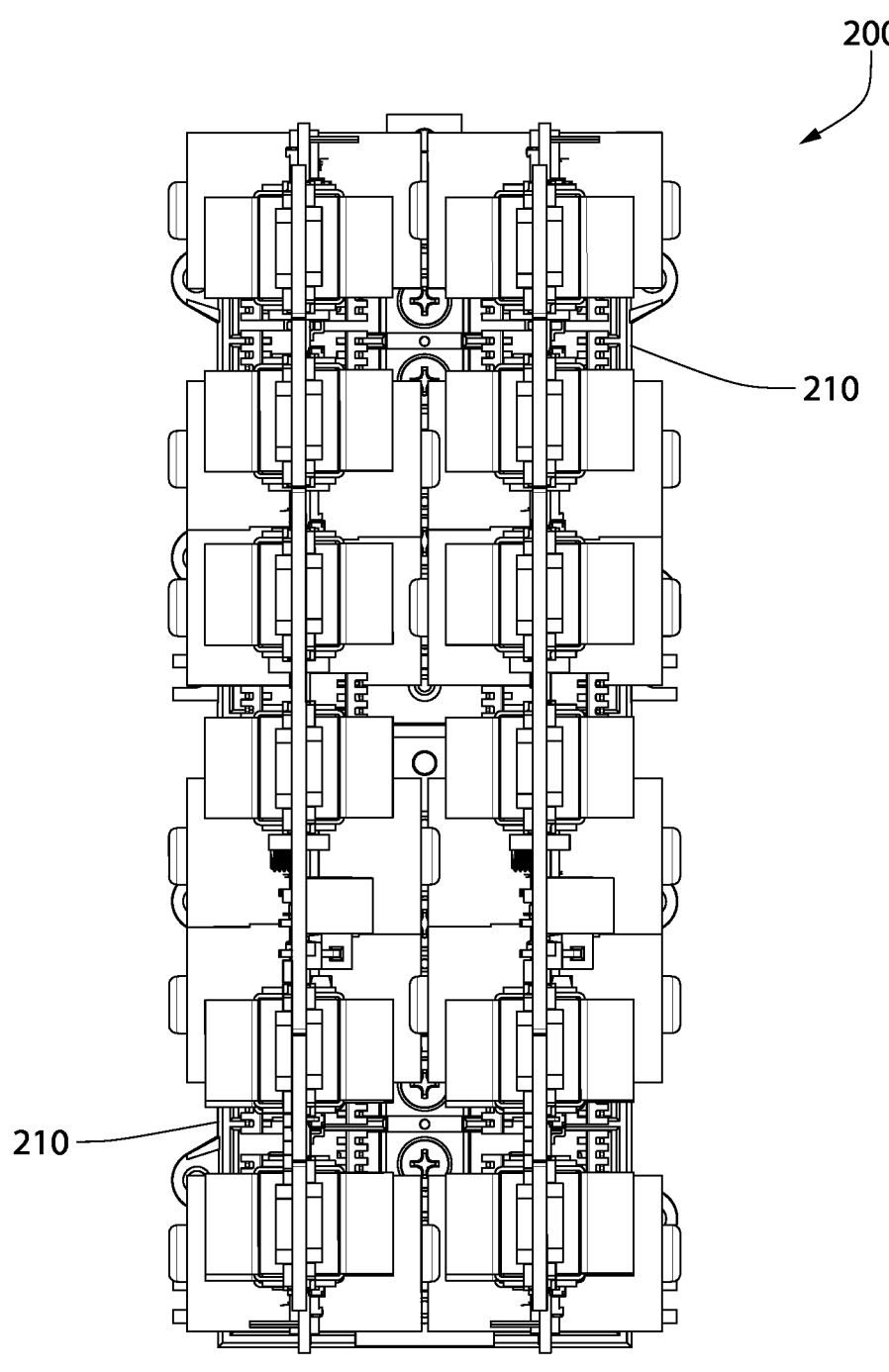
FIG. 11 is a top view of the variable capacitance apparatus.

FIG. 5 is a schematic of a variable capacitance system 155 for switching in and out discrete fixed capacitors of an electronically variable capacitor. Where this figure uses reference numbers similar to those of FIG. 4, it is understood that the relevant components can have features similar to those discussed in FIG. 4. The variable capacitance system 155 comprises a variable capacitor 151 for providing a varying capacitance. The variable capacitor 151 has an input 113 and an output 130. The variable capacitor 151 includes a plurality of discrete fixed capacitors 153 operably coupled in parallel. The plurality of capacitors 153 includes first (fine) capacitors 151a and second (coarse) capacitors 151B. Further, the variable capacitor 151 includes a plurality of switches 161. Of the switches 161, one switch is operably coupled in series to each of the plurality of capacitors to switch in and out each capacitor, thereby enabling the variable capacitor 151 to provide varying total capacitances. The variable capacitor 151 has a variable total capacitance that is increased when discrete capacitors 153 are switched in and decreased when the discrete capacitors 153 are switched out.

The switches 161 can be coupled to RF choke and filter circuits 137 and switch driver circuits 139 for driving the switches on and off. The variable capacitance system 155 can further include a control unit 145 operably coupled to the variable capacitor 151. Specifically, the control unit 145 can be operably coupled to the driver circuits 139 for instructing the driver circuits 139 to switch one or more of the switches 161 via the RF choke and filter circuits 137, and thereby turn one or more of the capacitors 153 on or off. The control unit 145, switch driver circuits 139, and RF choke and filter circuits 137 collectively form an operation circuit 148. In one embodiment, the control unit 145 can form part of a control unit that controls a variable capacitor, such as a control unit that instructs the variable capacitors of a matching network to change capacitances to achieve an impedance match. The RF choke and filter circuits 137, driver circuits 139, and control unit 145 can have features similar to those discussed above with reference to FIG. 4. These circuits may be combined or omitted as required to achieve switching of the capacitors 153 as desired.

Turning to FIGS. 6-14, a variable capacitance apparatus 200 is illustrated. The variable capacitance apparatus 200 is one exemplary implementation of the system described above. The variable capacitance apparatus 200 has first and second support structures 210 mounted to a base 202.

Optionally, the base 202 may be a heat sink or plate made of metal such as aluminum or may incorporate a heat sink. In yet other implementations, the base 202 may be made of a thermally conductive material, including both metallic and non-metallic materials. The support structures 210 may be formed of a molded, printed, or other material. Preferably the support structures 210 are formed of a material having a dielectric coefficient greater than air. In some configurations, the support structure 210 may be formed as a single unitary monolithic component or as separate components which are joined, overmolded, or coupled during or prior to assembly of the apparatus.

The first and second support structures 210 receive two second circuit boards 250. The second circuit boards 250 may engage third circuit boards 260. The second and third circuit boards 250, 260 may incorporate some or all of the operation circuit 148 described above. Thus, the second and third circuit boards 250, 260 may incorporate the RF choke and filter circuits 137, the switch driver circuits 139, and the control unit 145. Optionally, some or all of the RF choke and filter circuits 137, the switch driver circuits 139, and the control unit 145 may be located on the second circuit board 250 or the third circuit board 260. In other configurations, only a portion of one of the circuits 137, 139, and the control unit 145 may be located on the second circuit board 250 or the third circuit board 260.

Stated differently, the second circuit board 250 may incorporate some or all of the RF choke and filter circuit 137. The third circuit board may incorporate a remainder of the RF choke and filter circuit 137. In yet other configurations, the second circuit board 250 may incorporate some or all of the switch driver circuits 139 while the third circuit board 250 may incorporate a remainder of the switch driver circuits 139 and some or all of the RF choke and filter circuits 137. The control unit 145 and some portions of the RF choke and filter circuits 137 and the switch driver circuits 139 may be located elsewhere. As can be seen, the exact arrangement of the RF choke and filter circuits 137, the switch driver circuits 139, and the control unit 145 are not fixed. The second circuit board 250 incorporates a portion of the operation circuit 148 but the remainder of the operation circuit 148 may be located elsewhere.

The support structure 210 is mounted to the base 202 via fasteners 203. Optionally, the fasteners 203 may be screws or bolts which engage the base 202 or corresponding fasteners on an opposite side of the base 202. Thus, the support structure 210 may be mounted to the base 202 such that the support structure 210 is non-movable when the fasteners 203 are installed. The base 202 may be rigidly mounted within an enclosure or housing as dictated by the requirements of the system in which the variable capacitance apparatus 200 is utilized.

Figure 12:
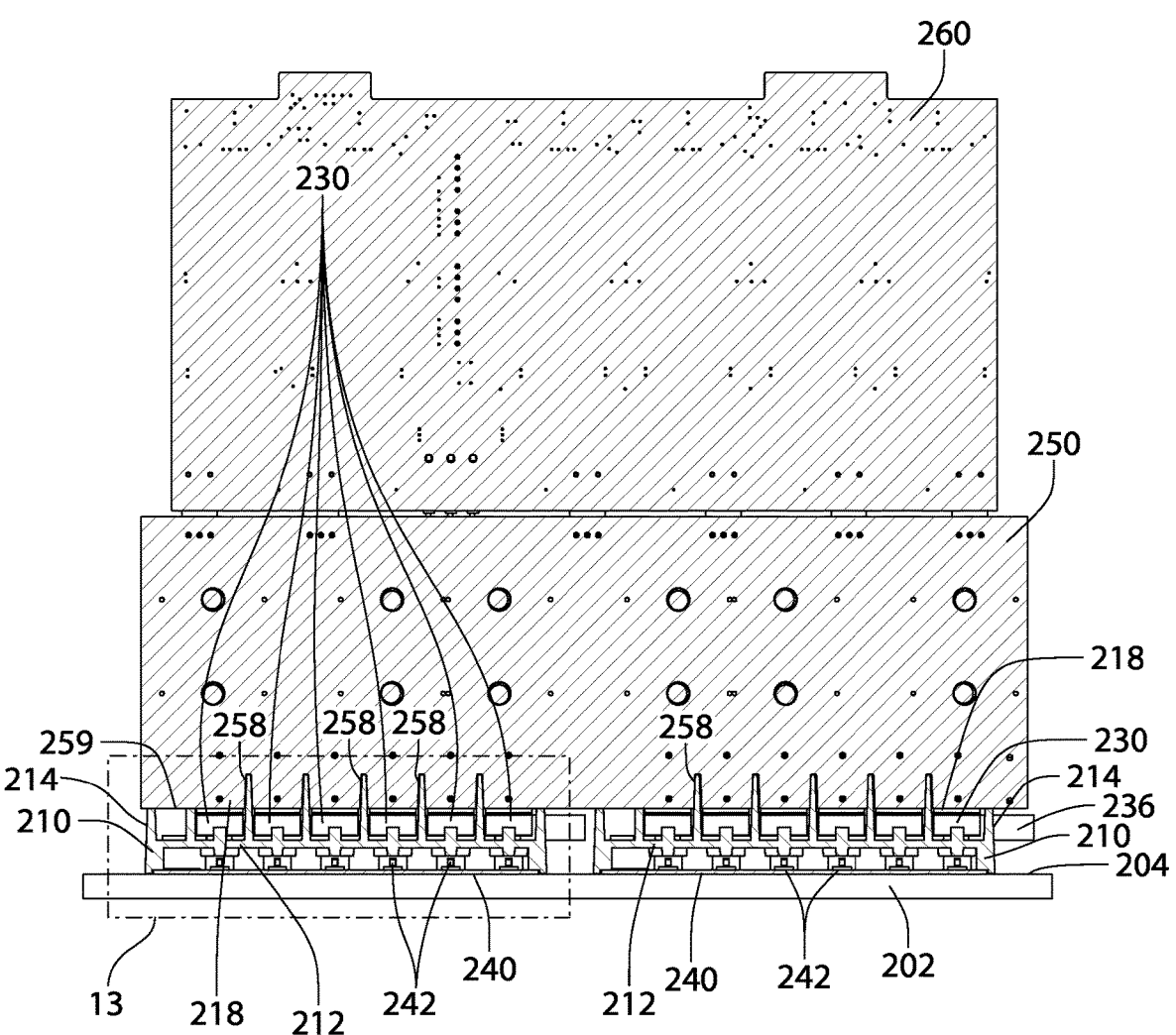
FIG. 12 is a cross-section view of the variable capacitance apparatus of FIG. 6 taken along line 12-12.
Figure 13:
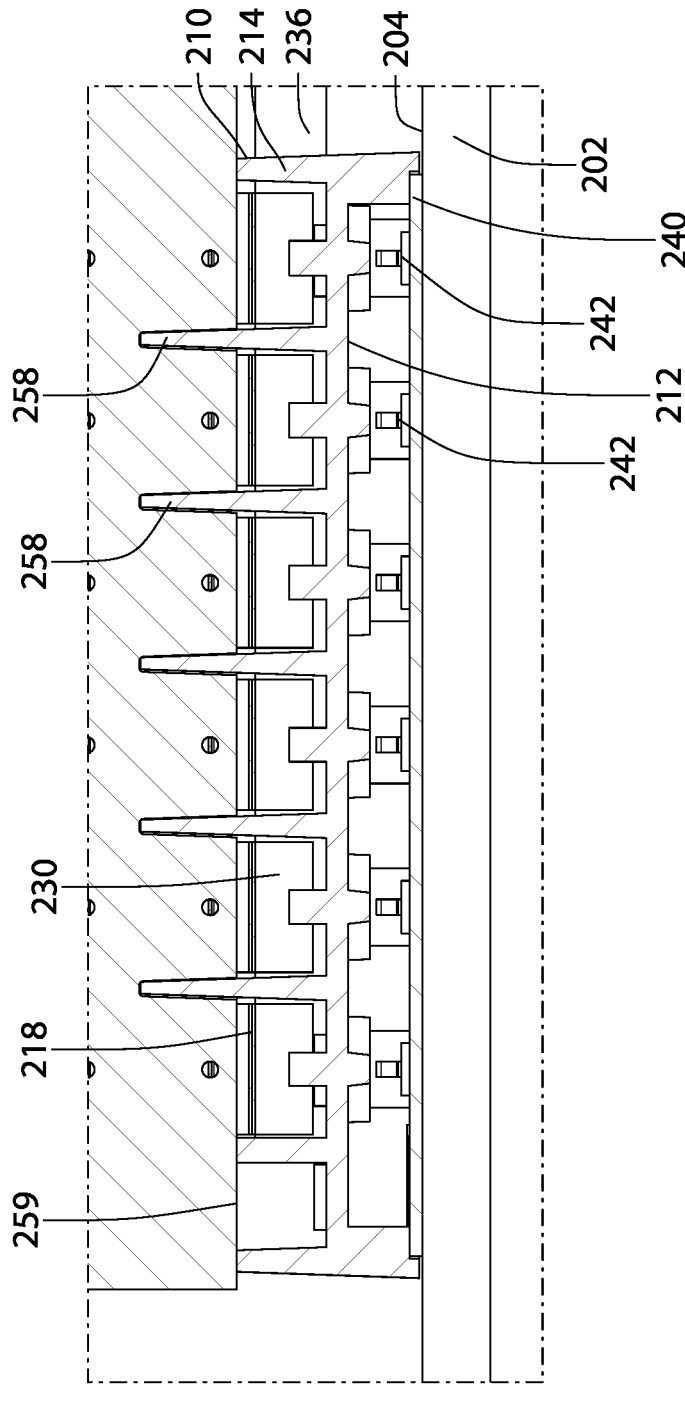
FIG. 13 is a detail view of a portion of the variable capacitance apparatus as shown in FIG. 12 taken at area 13.
Figure 14:
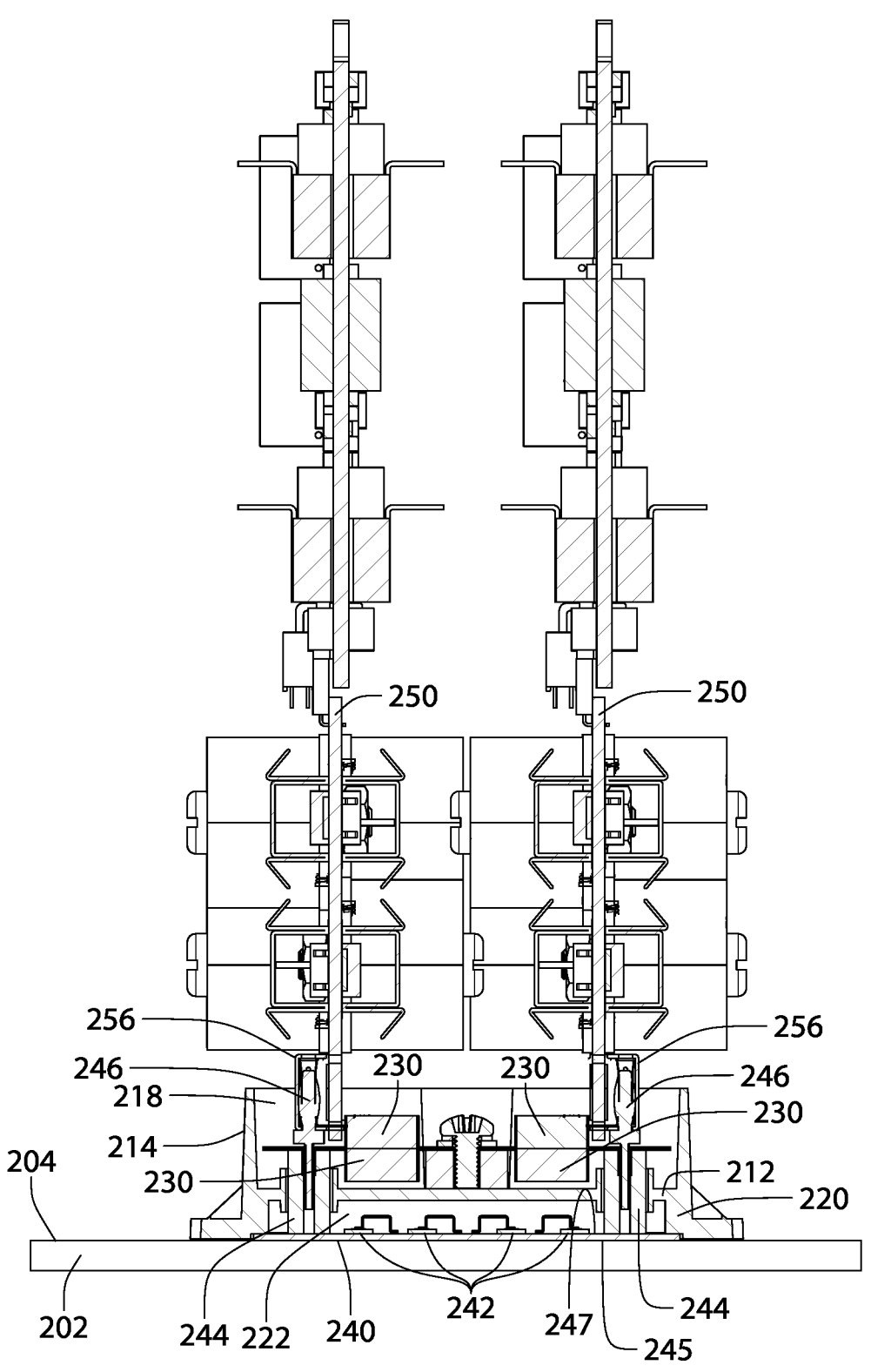
FIG. 14 is a cross-section view of the variable capacitance apparatus of FIG. 6 taken along line 14-14.
Figure 15:
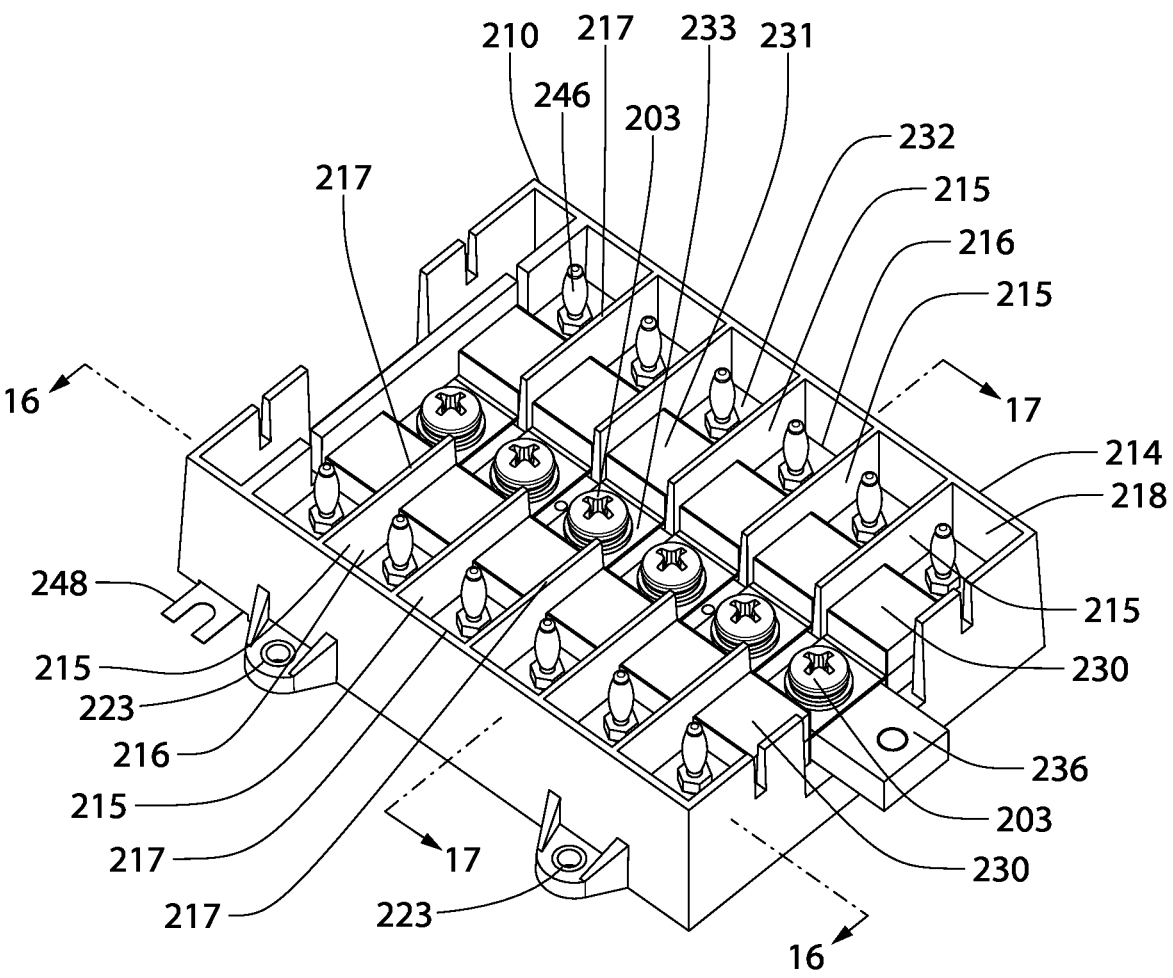
FIG. 15 is a perspective view of a portion of the variable capacitance apparatus.
Figure 16:
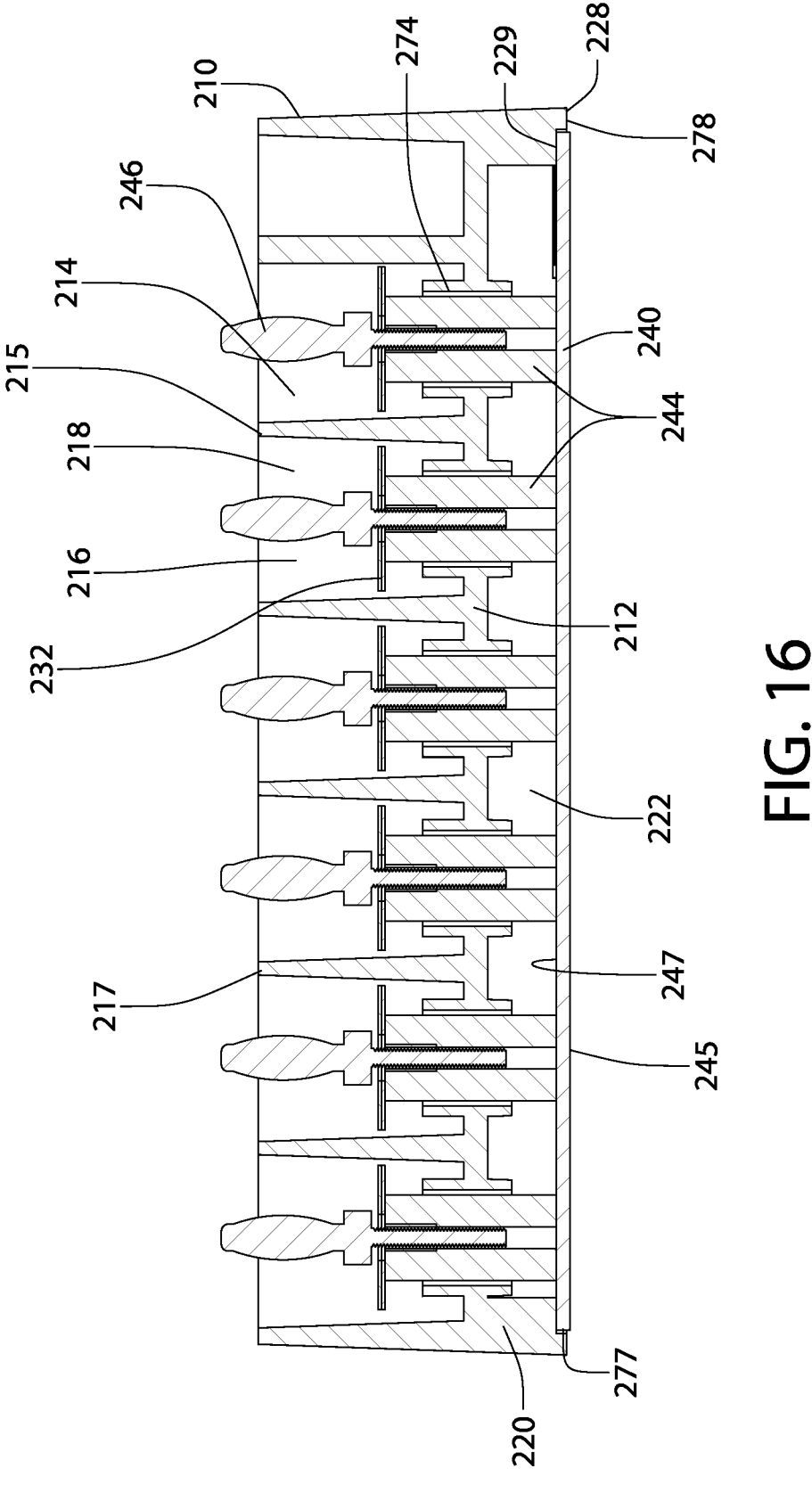
FIG. 16 is a cross-section view of the portion of the variable capacitance apparatus of FIG. 15 taken along line 16-16.
Figure 17:
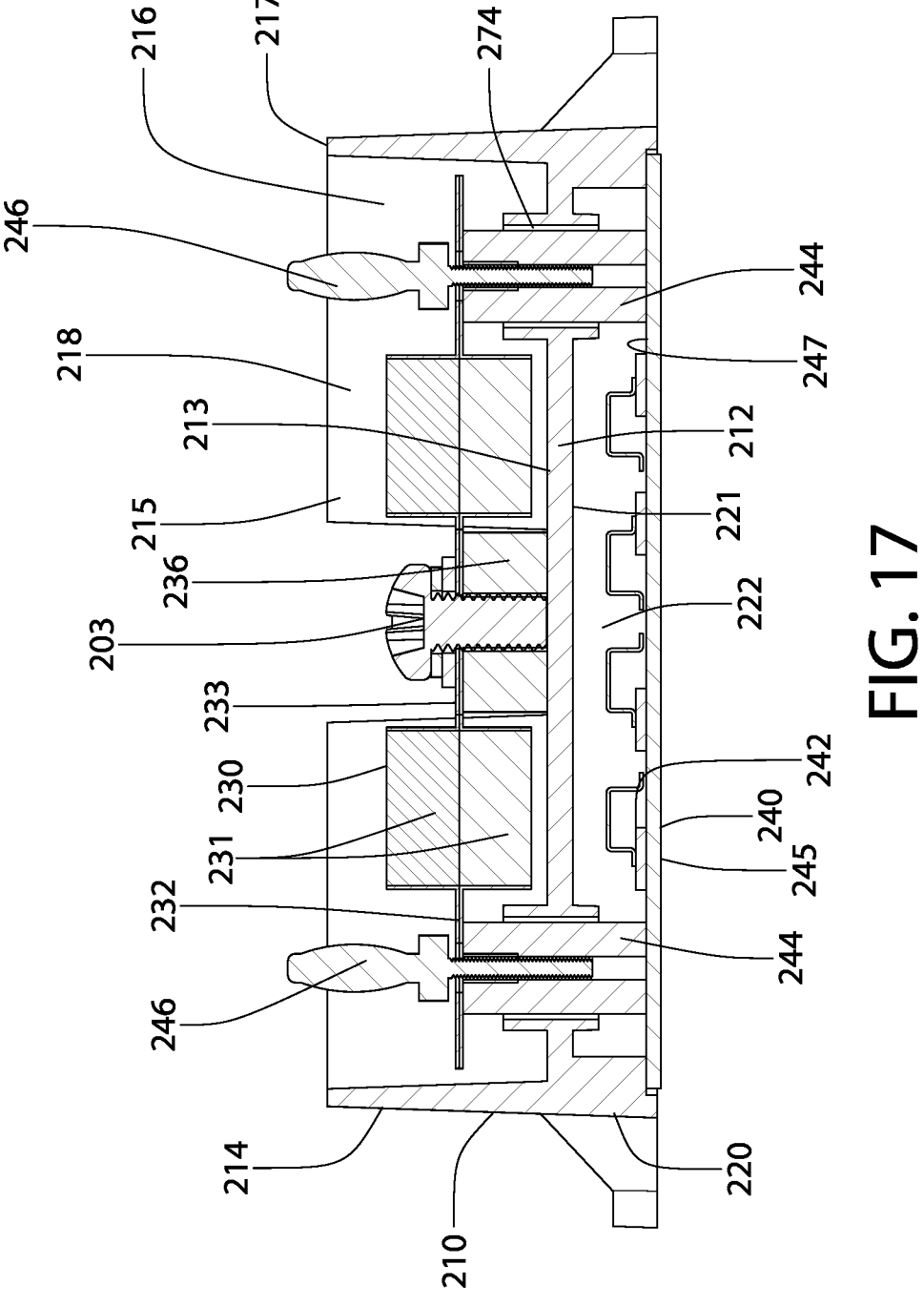
FIG. 17 is a cross-section view of the portion of the variable capacitance apparatus of FIG. 15 taken along line 17-17.
Figure 18:
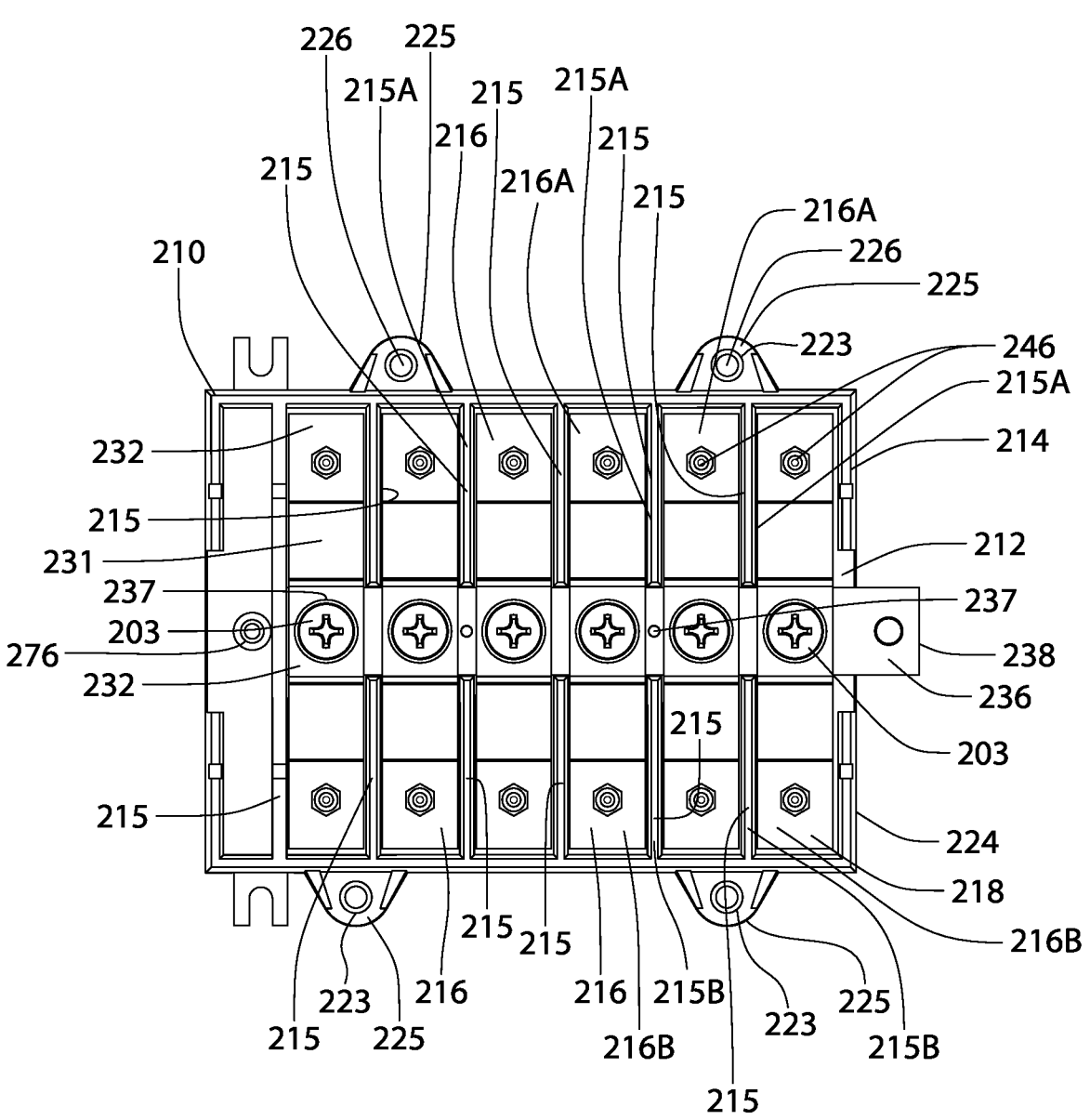
FIG. 18 is a top view of the portion of the variable capacitance apparatus.
Figure 19:
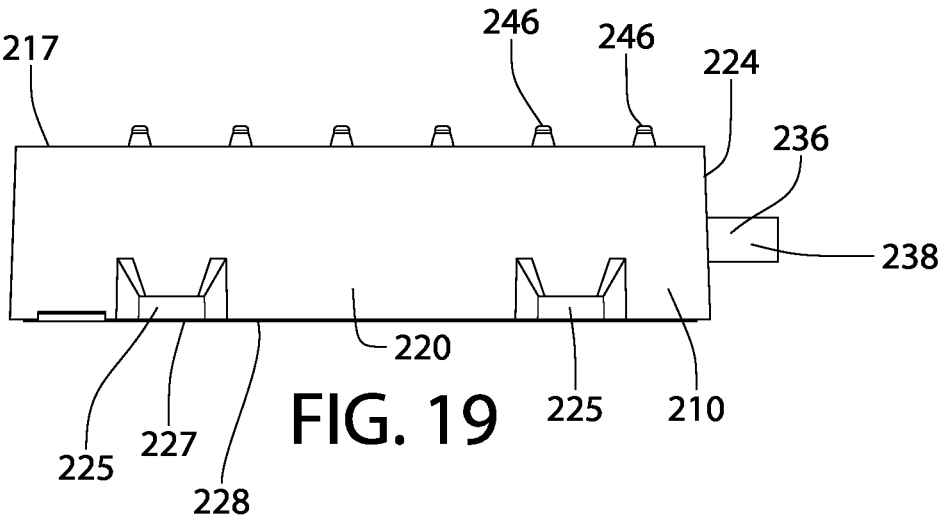
FIG. 19 is a front view of the portion of the variable capacitance apparatus.
Figure 20:
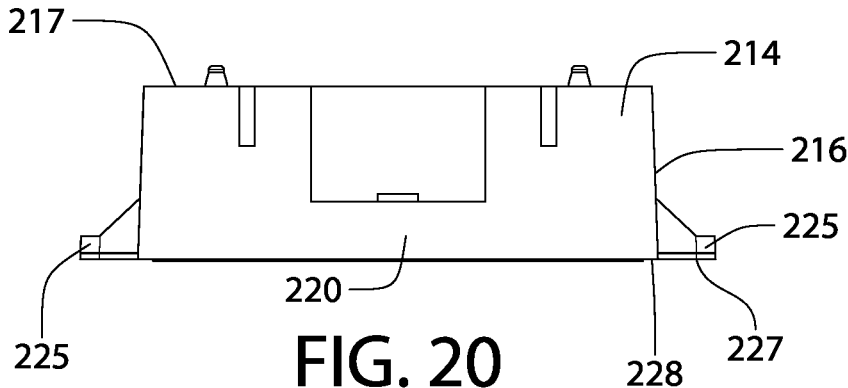
FIG. 20 is a left side view of the portion of the variable capacitance apparatus.
Figure 21:
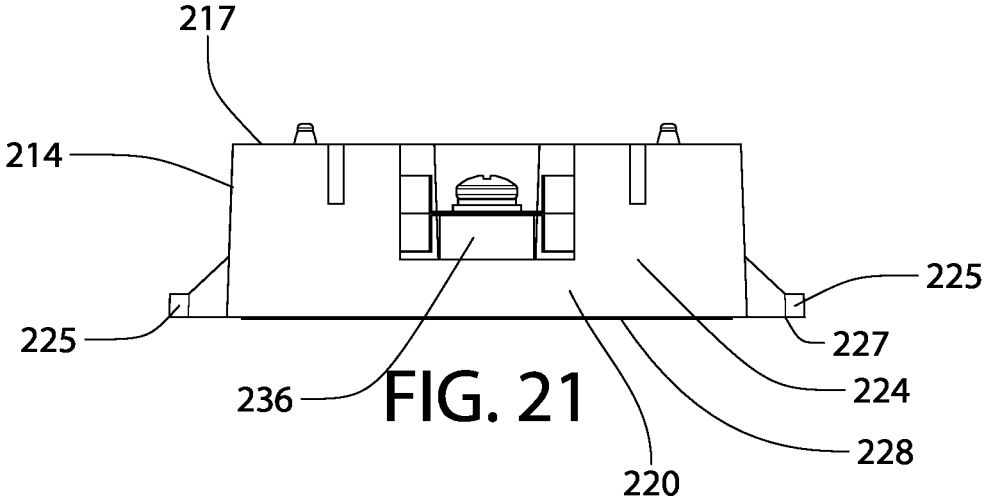
FIG. 21 is a right side view of the portion of the variable capacitance apparatus.
Figure 22:
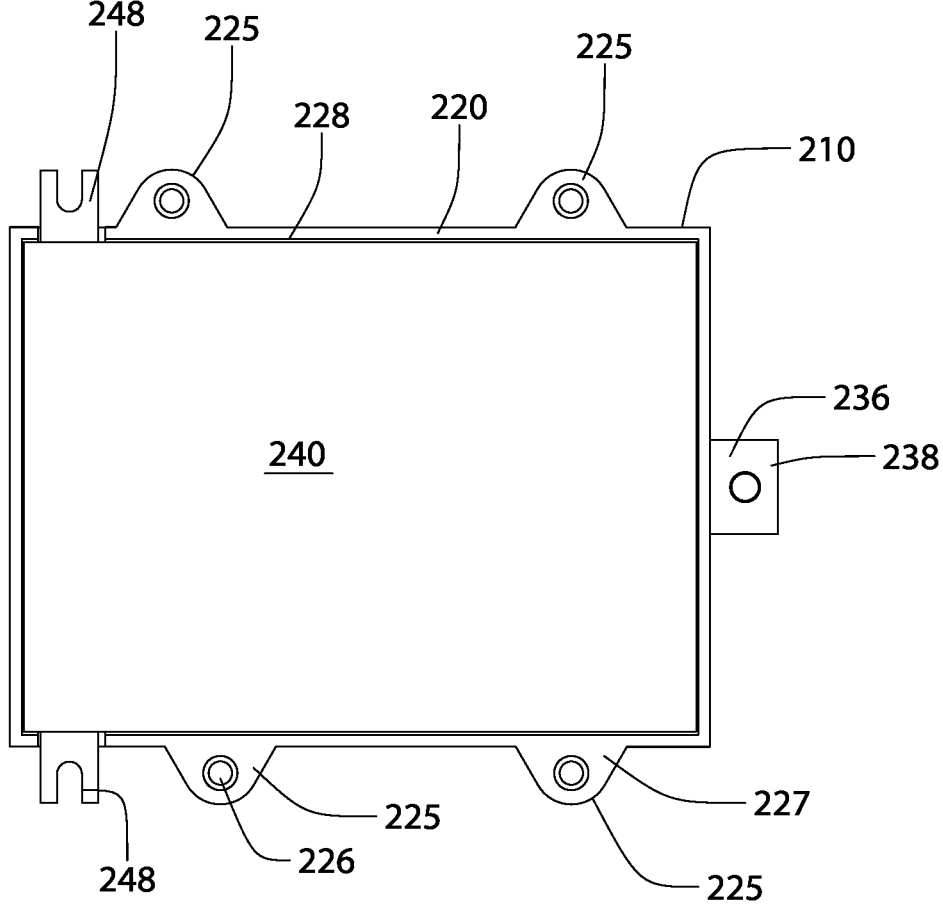
FIG. 22 is a bottom view of the portion of the variable capacitance apparatus.
Figure 23:
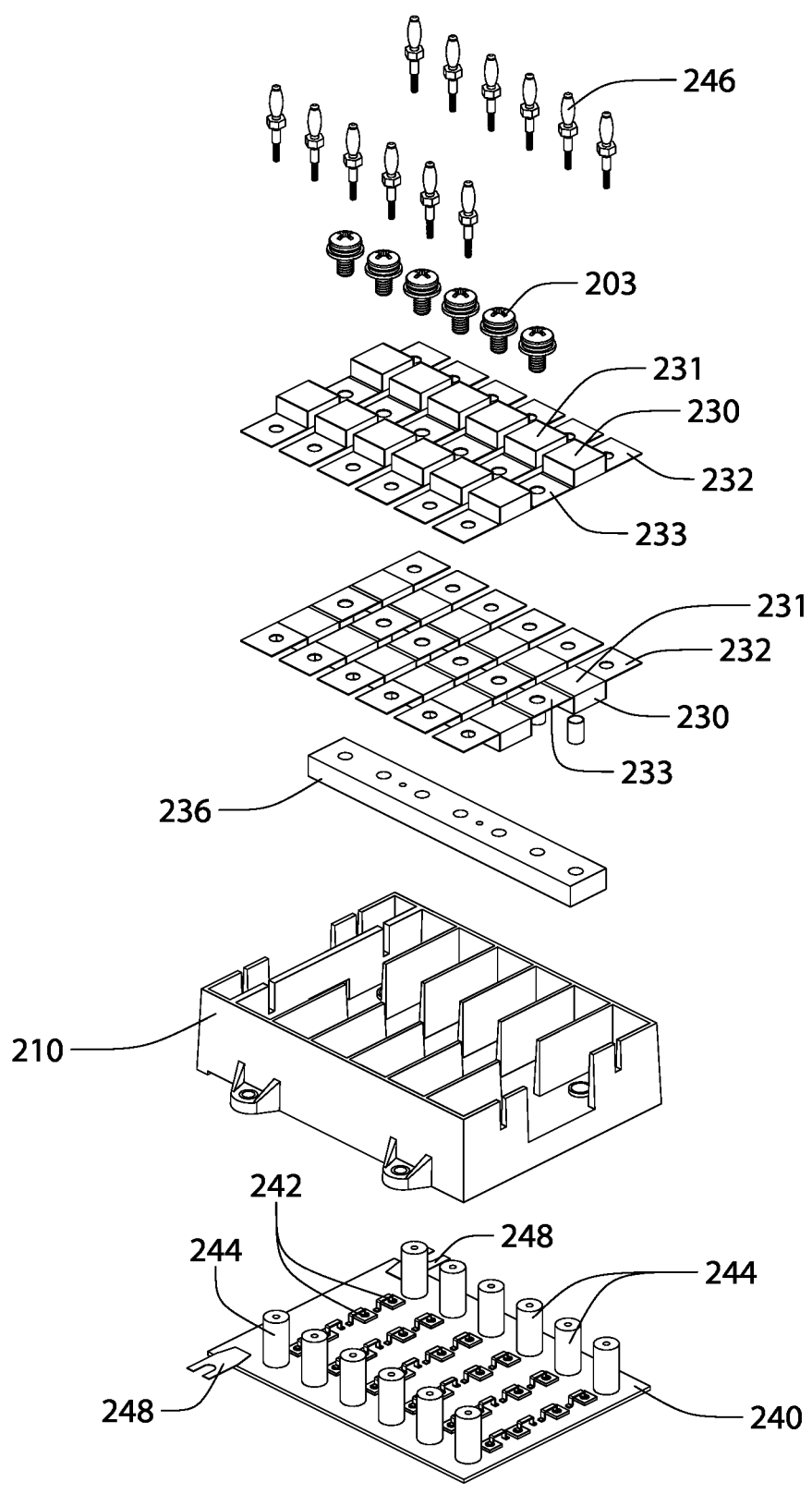
FIG. 23 is an exploded view of the portion of the variable capacitance apparatus.
Figure 24:
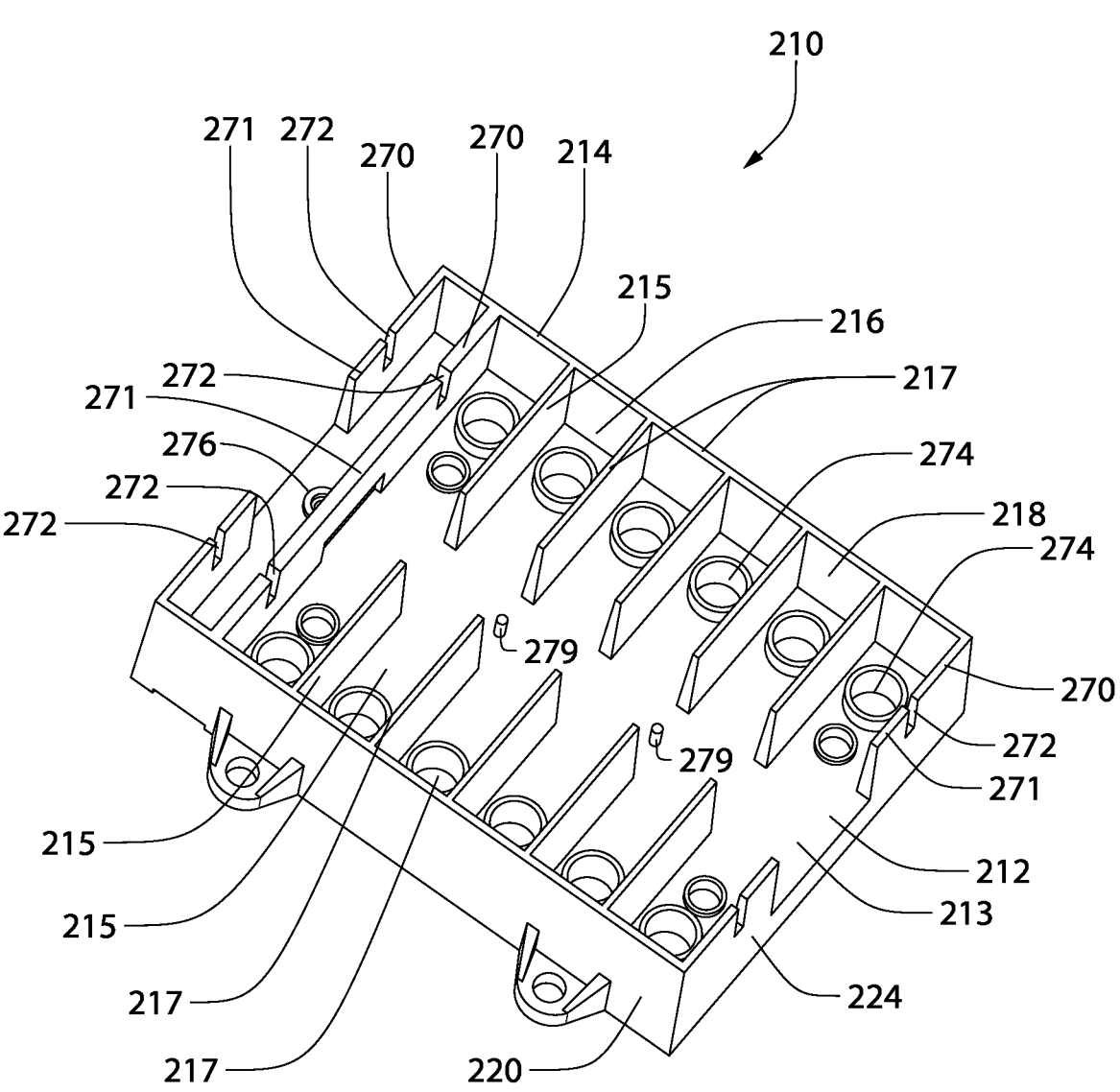
FIG. 24 is a perspective view of a support structure as used in the variable capacitance apparatus.
Figure 25:
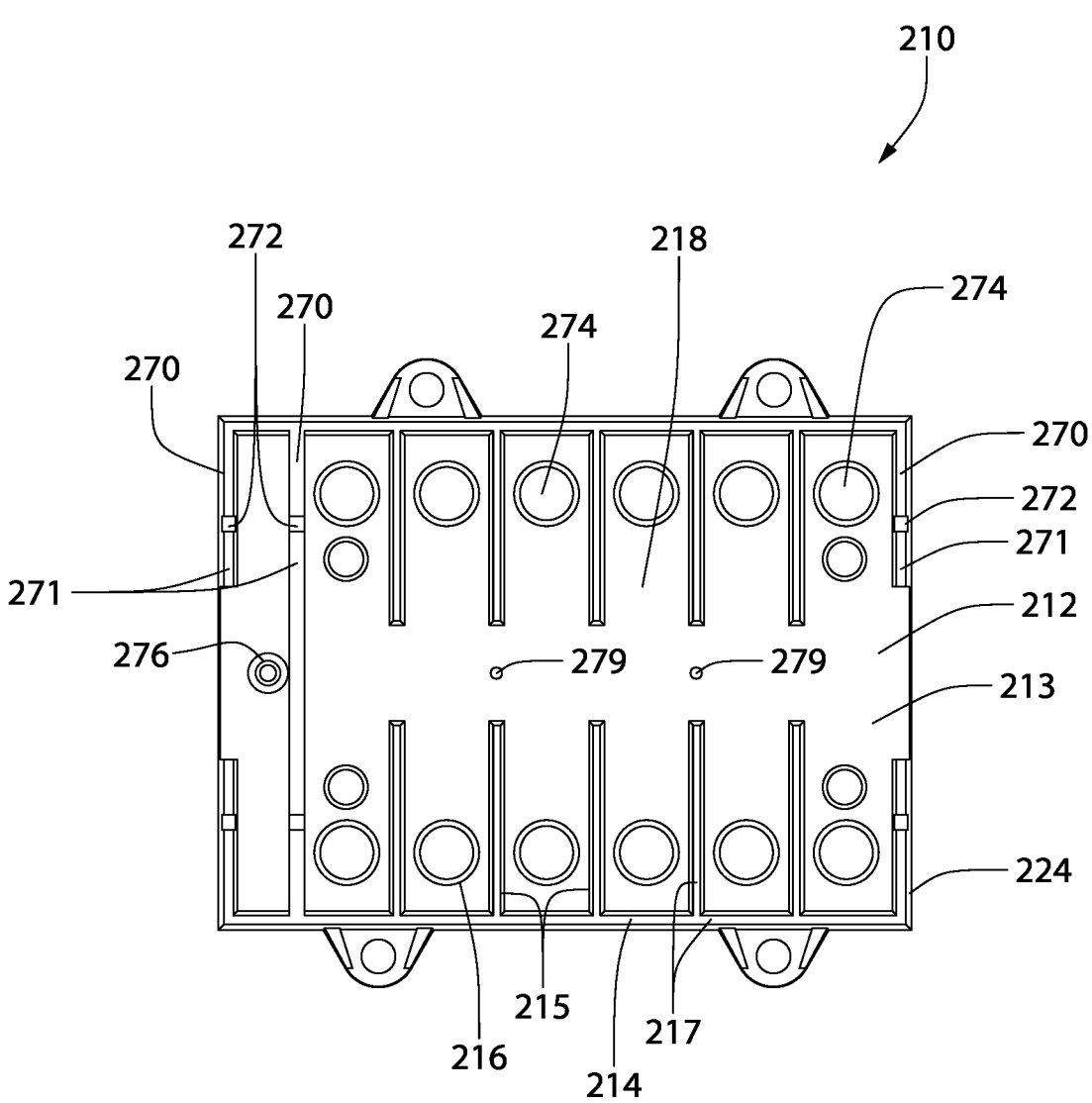
FIG. 25 is a top view of the support structure as used in the variable capacitance apparatus.
Figure 26:
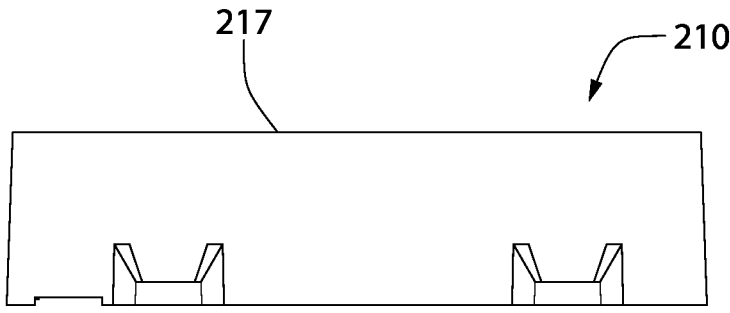
FIG. 26 is a front view of the support structure as used in the variable capacitance apparatus.
Figure 27:
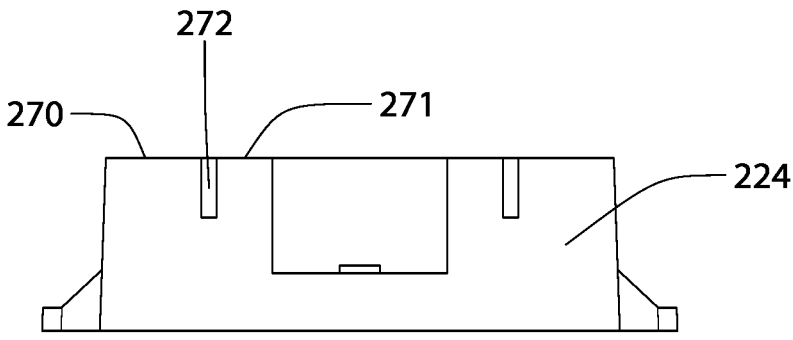
FIG. 27 is a left side view of the support structure as used in the variable capacitance apparatus.
Figure 28:
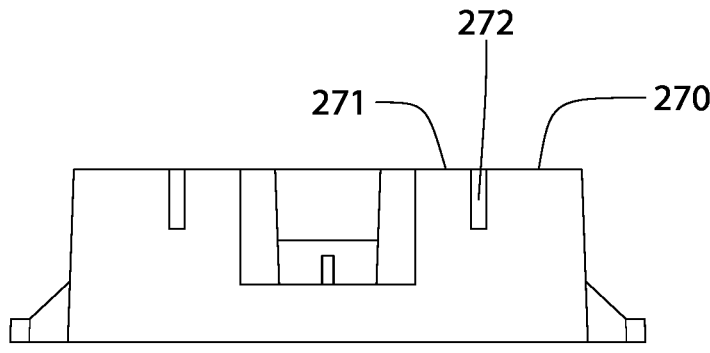
FIG. 28 is a right side view of the support structure as used in the variable capacitance apparatus.
Figure 29:
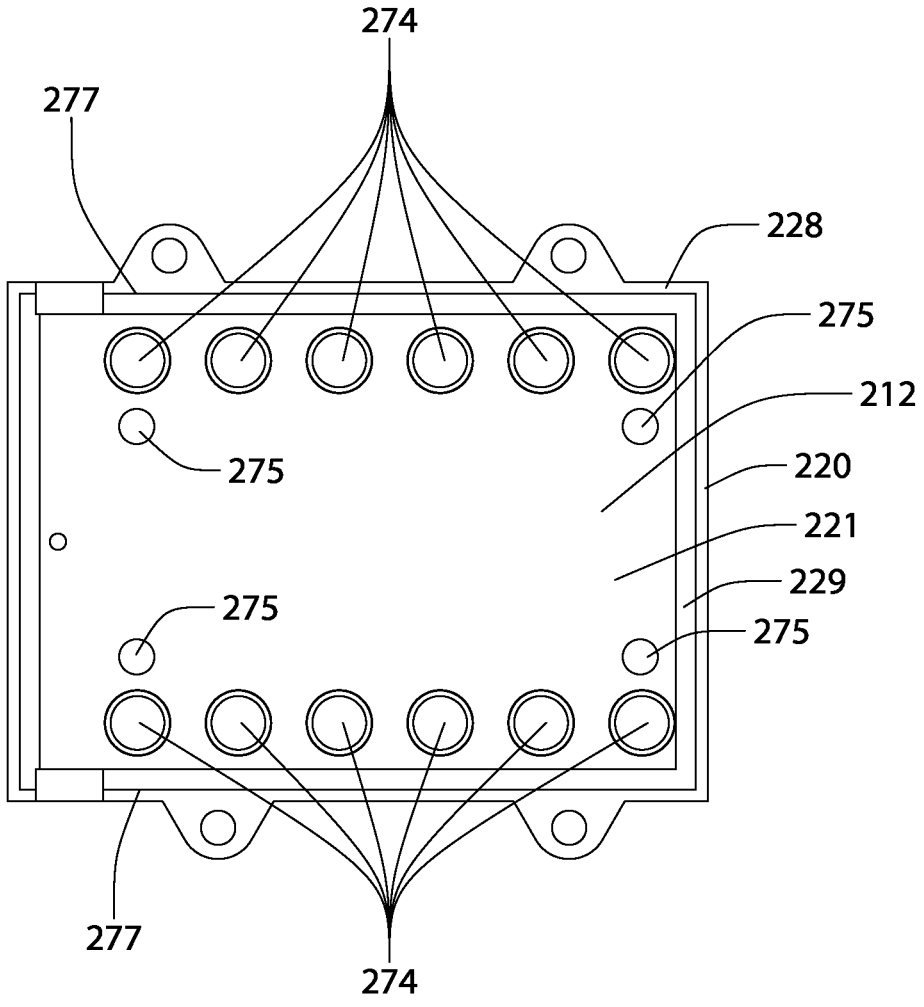
FIG. 29 is a bottom view of the support structure as used in the variable capacitance apparatus.

FIGS. 12-14 illustrate the variable capacitance apparatus 200 in cross-section. A first circuit board 240 is in contact with a top surface 204 of the base 202. The first circuit board 240 incorporates those circuits necessary to form a switching circuit unit. The first circuit board 240 has switches 242 operably mounted thereon. The switches 242 may be PIN diodes or NIP diodes. The switches 242 are functionally identical to the switches 161 described above. Optionally, the switches 242 may also be relays, transistors, or any other switching device as known in the art. Further optionally, a thermal grease or paste may be used between the first circuit board 240 and the base 202. The fasteners 203 may be used to ensure intimate contact between the first circuit board 240 and the base 202 and maximize heat transfer to the base 202. Optionally, the first circuit board 240 may be formed of an electrically insulating material that has high thermal conductivity. Materials may include $Al_2O_3$(Alumina), AlN (Aluminum Nitride), BeO (Beryllium Oxide), or a metalized substrate.

A plurality of capacitor units 230 are electrically coupled to the switches 242 on the first circuit board 240 as will be discussed in greater detail below. The capacitor units 230 are also electrically coupled to the second circuit board 250. The capacitor units 230 are functionally identical to the capacitors 153 described above. In yet other implementations, the capacitor units 230 may be substituted for inductors or any other electrical component which has a reactance. Otherwise stated, the capacitor units 230 may incorporate any electrical component which has a non-resistive component of impedance. Thus, the capacitor units 230 may be any electrical component which has a non-resistive impedance. The capacitor units 230 may also contribute some resistance to the total impedance, but in most applications the resistance is minimized. In yet other implementations, the capacitor units 230 may comprise a circuit board that comprises one or more capacitors 153 or inductors.

The support structures 210 each comprise a platform 212. The platform 212, along with an upper outer wall 214, form an upper basin 218. The upper basin 218 receives the plurality of capacitor units 230. The platform 212 and a lower outer wall 220, form a lower basin 222 which receives the first circuit board 240. The first circuit board 240 is located between the support structure 210 and the upper surface 204 of the base 202.

A plurality of standoff posts 244 extend from the first circuit board 240 to enable electrical connection between the switches 242 of the first circuit board 240 and the capacitor units 230. In addition, a plurality of electrical contact pins 246 are mechanically and electrically coupled to the standoff posts 244. The plurality of electrical contact pins 246 engage a corresponding plurality of electrical contact jacks 256 on the second circuit boards 250. The standoff posts 244 serve as switch contacts which are electrically coupled to the switches 242 to enable control of the switches 242 via the second circuit boards 250. The standoff posts 244 also serve to electrically couple the capacitor units 230 to the switches 242. The standoff posts 244 extend through the platform 212 of the support structure 218.

A common capacitance electrode 236 is electrically coupled to the plurality of capacitor units 230. The common capacitance electrode 236 is a busbar that couples the plurality of capacitor units 230 and allows external connection to the plurality of capacitor units 230.

The second circuit boards 250 engage the support structure 210 as discussed above. The electrical contact jacks 256 of the second circuit boards 250 engage the electrical contact pins 246. The electrical contact pins may be plugs such as banana plugs, or any other electrical contact which is suitable for engaging the corresponding electrical contact jacks 256 of the second circuit board 250. Each of the second circuit boards 250 has a plurality of slots 258 which are generally formed as elongate slots on a lower edge 259 of the second circuit board 250. The slots 258 engage the support structure 210 as discussed in greater detail below.

Turning to FIGS. 15-23, the variable capacitance apparatus 200 is shown with the second and third circuit boards 250, 260 omitted. The support structure 210 has a platform 212 an upper outer wall 214 to form an upper basin 218 as discussed previously. The upper outer wall 214 extends from an upper surface 213 of the platform 212. In addition, a plurality of walls 215 extend from the upper surface 213 of the platform 212 and from the upper outer wall 214. A plurality of channels 216 are formed between adjacent ones of the plurality of walls 215. Thus, the upper outer wall 214 may bound ends of the plurality of channels 216. Some of the plurality of channels 216 are also formed between the upper outer wall 214 and one of the plurality of walls 215. The plurality of walls 215 are parallel to one another, but in other implementations the plurality of walls 215 may be non-parallel.

The plurality of capacitor units 230 are installed within the plurality of channels 216. The plurality of walls 215 extend between capacitor units 230 in adjacent ones of the plurality of channels 216, ensuring that no arcing or other electrical contact between capacitor units 230 is possible. This is further aided by the use of a dielectric material having a higher dielectric strength than air for the plurality of walls 215 or the entire support structure 210. The support structure 210 may be formed of a plastic material such as nylon or another polymer. In yet other implementations, the support structure 210 may be at least partially formed of fiberglass or a ceramic material. For instance, a glass filled nylon may be used to provide the necessary dielectric strength while simultaneously providing other necessary mechanical properties.

The plurality of capacitor units 230 are installed with either one or two capacitor units 230 in a channel 216. Each of the capacitor units 230 is formed of a capacitor 231, a first capacitor lead 232, and a second capacitor lead 233. The first and second capacitor leads 232, 233 may be flat electrodes such as ribbon leads or microstrip leads or may be wire leads or other leads or electrodes as desired. Preferably, the first and second capacitor leads 232, 233 are offset such that they are substantially parallel with one side of the capacitor 231. This allows mounting the capacitor units 230 on a planar surface or allows back to back mounting of capacitor units 230 within a single channel 216.

The first capacitor leads 232 are electrically coupled to the standoff posts 244 of the first circuit board 240. The second capacitor leads 233 are electrically coupled to the common capacitance electrode 236. The plurality of capacitor units 230 are detachably mounted to the support structure 210. The first capacitor leads 232 are secured to the standoff posts 244 via threaded connections between the standoff posts 244 and the plurality of electrical contact pins 246. Thus, the electrical contact pins 246 serve as fasteners which provide both mechanical and electrical connection between the first capacitor leads 232, the standoff posts 244, and the electrical contact pins 246. The electrical contact pins 246 compress the first capacitor leads 232 between the plurality of electrical contact pins 246 and the plurality of standoff posts 244. The first capacitor leads 232 and the standoff posts 244 are coupled within the channels 216. Thus, the standoff posts 244 extend through the platform 212 and into the channels 216, allowing electrical coupling between the first capacitor leads 232 and the switches 244 through the platform 212.

The second capacitor leads 233 are secured to the common capacitance electrode 236 via fasteners 203. The fasteners 203 ensure mechanical and electrical connection between the second capacitor leads 233 and the common capacitance electrode 236. The common capacitance electrode 236 may incorporate threads or a hole and additional fastener which engages the fasteners 203. Preferably, the fasteners 203 are coupled via a threaded connection to ensure simple disassembly. This ensures that the capacitor units 230 can be removed quickly and easily for replacement or adjustment. Preferably, the first and second capacitor leads 232, 233 are mounted via thread connection or other non-permanent connection. Processes such as brazing, welding, soldering, or adhesive bonding or joining are not preferred due to their corresponding reduction in case of removal of the capacitor units 230. Furthermore, it should be noted that a single fastener 203 couples the second capacitor leads 233 of capacitor units 230 within different channels 216 on opposite sides of the common capacitance electrode 236.

The capacitor units 230 are installed within the plurality of channels 216 such that the plurality of capacitor units 230 and the plurality of walls 215 are all located within the upper basin 218. Top edges 217 of the plurality of walls 215 and a top edge 217 of the upper outer wall 214 are at a height above the capacitors 231 of the plurality of capacitor units 230 and the standoff posts 244. Thus, there is no line of sight between the capacitors 231 of the plurality of capacitor units 230 located in adjacent ones of the plurality of channels 216. Stated differently, there is no direct path between capacitors 231 within adjacent channels 216 which is not obstructed by one of the plurality of walls 215. Channels 216 which are located opposite the common capacitance electrode 236 may have a line of sight which is not obstructed by one of the plurality of walls 215. However, arcing will not occur because the second leads 233 of the capacitor units 230 are all coupled to the common capacitance electrode 236. Isolation of the second leads 233 is of minimal importance as compared with isolation of the first capacitor leads 232 because the first capacitor leads 232 may be at different electrical potentials while the second capacitor leads 233 are at the same electrical potential.

The plurality of walls 215 may be divided into a first set 215A of walls 215 forming a first set 216A of the plurality of channels 216 and a second set 215B of walls 215 forming a second set 216B of the plurality of channels 216. The first set 215A of walls 215 and the first set 216A of channels 216 are located on one side of the common capacitance electrode 236. The second set 215B of walls 215 and the second set 216B of the channels 216 are located on a second side of the common capacitance electrode 236 opposite the first side. Thus, the plurality of capacitor units 230 may also be divided into a first set of capacitor units 230 and a second set of capacitor units, with each set located within their respective channels 216A, 216B.

Furthermore, no conformal coating materials, potting materials, or other encapsulating material is used on the capacitor units 230. This further cases service and modification of the system by precluding the need to remove potting material or conformal coating material in order to remove the capacitor unit 230. In addition, there is no need to recoat or re-pot the capacitor unit 230 after service.

The common capacitance electrode 236 is mounted to the upper surface 213 of the platform 212 of the support structure 210. The common capacitance electrode 236 incorporates a plurality of alignment features 237 which engage corresponding features on the upper surface 213 of the platform 212. The alignment features 237 are holes, but may also be protuberances or simply outer surfaces of the common capacitance electrode 236. Finally, a portion 238 of the common capacitance electrode 236 extends beyond a first side 224 of the support structure 210. This enables connection to external components of the system in which the variable capacitance apparatus 200 is installed. Thus, the variable capacitance of the variable capacitance apparatus is provided via the portion 238 of the common capacitance electrode 236 that extends beyond the first side 224 of the support structure 210.

The support structure 210 further comprises feet 225 having mounting holes 226 extending therethrough. The mounting holes 226 may incorporate inserts 223 to prevent cold flow of the material used for the support structure 210. The feet 225 have a bottom surface 227 which is co-planar with a lower edge 228 of a lower outer wall 220. The feet 225 may be secured to the upper surface 204 of the base 202 via fasteners 203 as noted above. The bottom surfaces 227 and the lower edge 228 of the lower outer wall 220 are spaced from the upper surface 204 when the support structure 210 is installed onto the base 202. This is because the first circuit board 240 protrudes from the support structure 210. A bottom surface 245 of the first circuit board 240 is placed in intimate contact with the upper surface 204 of the base 202 to maximize heat transfer between the base 202 and the first circuit board 240.

The first circuit board 240 is mounted within a lower basin 222 of the support structure 210 as will be discussed in greater detail below. The first circuit board 240 is supported by the lower outer wall 220 such that the fasteners 203 apply pressure to the feet 225 which is in turn transferred to the first circuit board 240 as a compression force. A gap between the bottom surface 227 of the feet 225 and the upper surface 204 of the base 202 ensures that the first circuit board 240 is biased into surface contact with the base 202 regardless of dimensional variations in both the support structure 210 and the first circuit board 240. In addition, a plurality of electrical contacts 248 extend from the first circuit board 240 and are also secured to the base 202 via fasteners 203. The electrical contacts 248 allow electrical connection between the base 202 and the first circuit board 240. The base 202 may optionally serve as a common reference for the first, second, and third circuit boards 240, 250, 260 and the capacitor units 230. In addition, the base 202 may incorporate electrical contacts 205 which connect the base 202 to the second circuit board 250 to provide a common reference to the second circuit board 250. In other implementations, the bottom surface of the first circuit board 240 may be metalized and be connected to traces on the top surface of the first circuit board 240 using holes or end metallization. This may be done to eliminate the use of the electrical contacts 248.

Turning to FIGS. 24-29, the support structure 210 is illustrated in isolation. The support structure 210 has the plurality of walls 215 extending from the upper surface 213 of the platform 212 as discussed above. The upper outer wall 214 and the upper surface 213 of the platform 212 form the upper basin 218. The lower outer wall 220 and a bottom surface 221 of the platform 212 form the lower basin 222. The bottom surface 221 of the platform 212 forms a roof of the lower basin 222. The lower outer wall 220 has a lower edge 228 as noted above. The lower edge 228 incorporates a tread surface 229 and a riser surface 277. The tread surface 229 receives a perimeter portion of the first circuit board 240.

Preferably, the riser surface 277 has a height as measured from the tread surface 229 to a lowermost surface 278 of the lower edge 228. The height of the riser surface 277 is less than a thickness of the first circuit board 240 as measured from the bottom surface 245 to a top surface 247. Otherwise stated, the thickness of the first circuit board 240 is greater than the height of the riser surface 277. This is done to ensure surface contact between the bottom surface 245 of the first circuit board 240 and the upper surface 204 of the base 202. Optionally, the first circuit board 240 may be installed using an adhesive to form a seal between the perimeter portion of the first circuit board 240 and the lower edge 228 of the lower outer wall 220. Thus, the first circuit board 240 forms a lower boundary of the lower basin 222.

During assembly of the first circuit board 240 to the support structure 210, an adhesive may be used to attach the first circuit board 240 within the recess 229 as noted above. During installation of the first circuit board 240 within the recess 229, the standoff posts 244 extend through apertures 274 formed in the platform 212. The apertures 274 have cylindrical protrusions which extend below the bottom surface 221 of the platform and above the upper surface 213 of the platform 212. The apertures 274 are preferably a close sliding fit with the standoff posts 244.

Once the first circuit board 240 is coupled to the support structure 210 to enclose the lower basin 222, a potting material is used to fill the lower basin 222. The potting material is preferably of a self-healing gel type which is capable of healing if disturbed or otherwise penetrated. Alternately, a flexible potting material may be used which does not self-heal but remains flexible to allow for expansion and contraction of components on the first circuit board 240. Preferably, the potting material is installed through one or more holes 276, with air allowed to escape from other ones of the vent holes 275. The extension of the apertures 274 below the bottom surface 221 of the platform 212 ensures that the potting material can completely seal the aperture 274. Even if the potting material does not reach the bottom surface 221, no path through air can exist between adjacent ones of the standoff posts 244 within the lower basin 222. However, no potting material is located within the upper basin 218. The hole 276 has a small annular wall which extends above the upper surface 213 of the platform 212 to catch excess potting material.

In addition, the upper outer wall 214 of the support structure 210 has a slotted wall 270. The slotted wall 270 has an upper edge 271 and a slot 272 extending downward from the upper edge 271 toward the platform 212. A second slotted wall 270 extends from the upper surface 213 of the platform 212. The second slotted wall also has an upper edge 271 and a slot 272 extending downward from the upper edge 271 toward the platform 212. The plurality of slots 258 on the lower edge 259 of the second circuit board 250 engage the plurality of walls 215. The slots 272 of the slotted walls 270 engage a lower portion of the second circuit board 250. Thus, the second circuit board 250 is mounted to the support structure 210 in an upright manner relative to the platform 212. The second circuit board 250 is mounted by slidable mating of the plurality of walls 215 within the plurality of slots 258 of the second circuit board 250. The second circuit board 250 is also mounted by slidable mating of a lower portion of the second circuit board 250 within the slots 272 of the slotted walls 270 of the support structure 210.

The second circuit board 250 is further mounted to the support structure 210 by slidably mating the plurality of electrical contact pins 246 to the plurality of electrical contact jacks 256. As discussed above, the plurality of electrical contact pins 246 are positioned within the plurality of channels 216. The plurality of electrical contact pins 246 protrude upward from the platform 212. The plurality of electrical contact pins 246 are electrically coupled to the plurality of switches 242 and the plurality of capacitor units 230. The plurality of electrical contact jacks 256 are mounted on the second circuit board 250 and electrically coupled to a portion of the operation circuit 148 located on the second circuit board 250.

The support structure 210 also incorporates protuberances 279 extending from an upper surface 213 of the platform 212. The protuberances 279 engage the alignment features 237 of the common capacitance electrode 236 which are described above. The protuberances 279 are cylindrical in this embodiment, but need not be cylindrical. The protuberances 279 may be substituted for holes which engage corresponding alignment features 237 or any other structure which positions the common capacitance electrode 236. The protuberances 279 may also have a locking feature that holes the common capacitance electrode 236 in place once the common capacitance electrode 236 is installed in the support structure 210.

While the embodiments of a matching network discussed herein have used L or pi configurations, it is noted that the claimed matching network may be configured in other matching network configurations, such as a 'T' type configuration. Unless stated otherwise, the variable capacitors, switching circuits, and methods discussed herein may be used with any configuration appropriate for an RF impedance matching network.

While the embodiments discussed herein use one or more variable capacitors in a matching network to achieve an impedance match, it is noted that any variable reactance element can be used. A variable reactance element can include one or more discrete reactance elements, where a reactance element is a capacitor or inductor or similar reactive device.

While the foregoing description and drawings represent exemplary embodiments of the present disclosure, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. In addition, numerous variations in the methods/processes described herein may be made within the scope of the present disclosure. One skilled in the art will further appreciate that the embodiments may be used with many modifications of structure, arrangement, proportions, sizes, materials, and components and otherwise, used in the practice of the disclosure, which are particularly adapted to specific environments and operative requirements without departing from the principles described herein. The presently disclosed embodiments are therefore to be considered in all respects as illustrative and not restrictive. The appended claims should be construed broadly, to include other variants and embodiments of the disclosure, which may be made by those skilled in the art without departing from the scope and range of equivalents.

What is claimed is:

1. A variable capacitance apparatus comprising:
 a support structure comprising:
  a platform;
  a plurality of walls extending upward from the platform; and
  a channel formed between two adjacent ones of the walls; and
 a plurality of capacitor units, each of the plurality of capacitor units comprising a capacitor and first and second capacitor leads, the plurality of capacitor units mounted to the support structure so that one of the plurality of capacitors is positioned within the channel, wherein adjacent ones of the plurality of capacitors are separated from one another by one of the plurality of walls to prevent arcing therebetween.

2. The variable capacitance apparatus according to claim 1, wherein:

the plurality of capacitor units are detachably mounted to the support structure; and the variable capacitance apparatus is free of any conformal coating or potting over the plurality of capacitor units.

3. The variable capacitance apparatus according to claim 1, wherein:

the plurality of walls comprise a dielectric material; and the support structure further comprises an upper outer wall extending upward from the platform, the plurality of walls extending from the upper outer wall.

4. The variable capacitance apparatus according to claim 3, wherein the upper outer wall, in combination with an upper surface of the platform, forms an upper basin, the plurality of walls and the plurality of capacitors located within the upper basin.

5. The variable capacitance apparatus according to claim 1, further comprising:

a common capacitance electrode mounted to the support structure above the platform; and the second capacitor leads of the plurality of capacitor units electrically coupled to the common capacitance electrode.

6. The variable capacitance apparatus according to claim 1, further comprising a plurality of channels formed between adjacent ones of the walls, the plurality of capacitors positioned within the plurality of channels, wherein the plurality of walls prevent any line of sight from existing between capacitors located in adjacent ones of the plurality of channels.

7. The variable capacitance apparatus according to claim 1, further comprising:

the plurality of walls comprising a first set of walls forming a first set of channels and a second set of walls forming a second set of channels, the first and second set of channels positioned opposite one another;

the plurality of capacitor units comprising a first set of capacitor units having capacitors positioned within the first set of channels and a second set of capacitor units having capacitors positioned within second set of channels; and a common capacitance electrode mounted to the support structure, the first and second sets of channels located on opposite sides of the common capacitance electrode, the second capacitor leads of the capacitor units of the first and second sets of capacitor units electrically coupled to the common capacitance electrode.

8. The variable capacitance apparatus according to claim 1, further comprising:

a switching circuit unit comprising a first circuit board and a plurality of switches operably mounted on the first circuit board, the switching circuit unit positioned below the platform; and the plurality of capacitor units electrically coupled to the plurality of switches.

9. The variable capacitance apparatus according to claim 8, further comprising:

a plurality of channels formed between adjacent ones of the walls;

a plurality of switch contacts operably mounted on the first circuit board and electrically coupled to the plurality of switches, the plurality of switch contacts extending through the platform; and the first leads of the plurality of capacitor units electrically coupled to the plurality of switch contacts above the platform.

10. The variable capacitance apparatus according to claim 1, further comprising:

the support structure further comprising at least one slotted wall extending upward from the platform, the at least one slotted wall comprising an upper edge and a slot extending downward from the upper edge;

a second circuit board comprising a lower edge and a plurality of slots extending upward from the lower edge;

at least a portion of an operation circuit operably mounted on the second circuit board; and the second circuit board mounted to the support structure in an upright manner relative to the platform by: (1) slidable mating of the plurality of walls within the plurality of slots of the second circuit board; and (2) slidable mating of a lower portion of the second circuit board within the slot of the at least one slotted wall of the support structure.

11. The variable capacitance apparatus according to claim 10, further comprising:

a plurality of channels formed between adjacent ones of the walls;

a plurality of electrical contact pins positioned within the plurality of channels and protruding upward from the platform, the plurality of electrical contact pins electrically coupled to the plurality of switches and the plurality of capacitor units; and a plurality of electrical contact jacks mounted on the second circuit board and electrically coupled to the operation circuit;

wherein the pluralities of electrical contact jacks and electrical contact pins are slidably mated with one another to electrically couple the portion of the operation circuit to the plurality of capacitor units and the plurality of switches.

12. A variable capacitance apparatus comprising:

a support structure comprising:

a platform; and a lower basin beneath the platform, a bottom surface of the platform forming a roof of the lower basin; and a switching circuit unit comprising a first circuit board and a plurality of switches operably mounted on the first circuit board, the switching circuit unit disposed at least partially within the lower basin;

a potting material at least partially filling the lower basin and embedding the plurality of switches; and a plurality of capacitor units mounted to the support structure above the platform, the plurality of capacitor units electrically coupled to the plurality of switches.

13. The variable capacitance apparatus according to claim 12, further comprising:

a base; and the support structure mounted to the base so that a bottom surface of the first circuit board is in contact with a top surface of the base.

14. The variable capacitance apparatus according to claim 13, wherein the support structure is configured to apply a compression force on the first circuit board to maintain the bottom surface of the first circuit board in contact with the top surface of the base.

15. The variable capacitance apparatus according to claim 12, further comprising:

the support structure comprising a lower outer wall extending downward from the platform and terminating in a lower edge, the lower outer wall and the bottom surface of the platform forming the lower basin; and the lower edge of the lower outer wall contacting a perimeter portion of the first circuit board to seal the lower basin to prevent leakage of the potting material.

16. The variable capacitance apparatus according to claim 12, wherein the potting material is a self-healing gel.

17. The variable capacitance apparatus according to claim 12, wherein the platform comprises at least one vent forming a passageway between the lower basin and a space above the platform.

18. A variable reactance apparatus comprising:

a support structure comprising a platform, a plurality of walls, and at least one slotted wall;

a variable reactance circuit associated with the support structure;

a second circuit board comprising a lower edge and a plurality of slots extending upward from the lower edge;

at least a portion of an operation circuit operably located on the second circuit board; and the second circuit board mounted to the support structure in an upright manner relative to the platform by: (1) slidable mating of the plurality of walls within the plurality of slots of the second circuit board; and (2) slidable mating of a lower portion of the second circuit board within a slot of the at least one slotted wall of the support structure; and the portion of the operation circuit electrically coupled to the variable reactance circuit.

19. The variable reactance apparatus according to claim 18, further comprising:

the variable reactance circuit comprising:

a switching circuit unit comprising a first circuit board and a plurality of switches operably mounted on the first circuit board, the switching circuit unit disposed below the platform;

a plurality of switch contacts operably mounted on the first circuit board and electrically coupled to the plurality of switches, the plurality of switch contacts extending through the platform; and a plurality of first electrical contacts at distal ends of the plurality of switch contacts and a plurality of second electrical contacts mounted on the second circuit board and electrically coupled to the portion of the operation circuit;

the plurality of first and second electrical contacts in electrical coupling.

* * * * *